(12) United States Patent
Sekine

(10) Patent No.: US 6,586,811 B2
(45) Date of Patent: Jul. 1, 2003

(54) MICROLENS, SOLID STATE IMAGING DEVICE, AND PRODUCTION PROCESS THEREOF

(75) Inventor: Yasuhiro Sekine, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 43 days.

(21) Appl. No.: 09/825,839

(22) Filed: Apr. 5, 2001

(65) Prior Publication Data

US 2001/0051405 A1 Dec. 13, 2001

(30) Foreign Application Priority Data

| Apr. 7, 2000 | (JP) | ............................................. 2000-106345 |
| Jul. 4, 2000 | (JP) | ............................................. 2000-202242 |
| Mar. 22, 2001 | (JP) | ............................................. 2001-082867 |

(51) Int. Cl.[7] .................................................. H01L 31/0232
(52) U.S. Cl. ................................................................ 257/432
(58) Field of Search .............................. 257/98, 432, 436, 257/437

(56) References Cited

U.S. PATENT DOCUMENTS

| 4,982,079 A | 1/1991 | Yagyu .................. 250/208.1 |
| 6,163,352 A | 12/2000 | Ichikawa et al. ............ 349/106 |
| 6,172,723 B1 | 1/2001 | Inoue et al. ................... 349/95 |
| 6,271,103 B1 * | 8/2001 | Lee .............................. 438/464 |
| 6,271,900 B1 * | 8/2001 | Li ............................... 349/95 |
| 6,366,406 B1 * | 4/2002 | Hamanaka et al. .......... 359/619 |
| 6,419,800 B2 * | 7/2002 | Anzaki et al. .......... 204/192.12 |
| 6,436,265 B1 * | 8/2002 | Shimada et al. ............. 205/125 |
| 6,503,384 B1 * | 1/2003 | Teshima et al. ............. 205/118 |

FOREIGN PATENT DOCUMENTS

| EP | 843362 A1 | 5/1998 |
| EP | 948055 A2 | 10/1999 |
| JP | 10-150179 | 6/1998 |
| JP | 11-151758 | 6/1999 |
| JP | 11-153704 | 6/1999 |
| JP | 2000-108216 | 4/2000 |
| JP | 2000-266909 | 9/2000 |
| JP | 2000-307090 | 11/2000 |

* cited by examiner

Primary Examiner—David Nelms
Assistant Examiner—Quoc Hoang
(74) Attorney, Agent, or Firm—Fitzpatrick, Cella, Harper & Scinto

(57) ABSTRACT

A microlens of which surface is a conductive surface, or a solid state imaging device equipped with the microlens, in which the conductive surface can be given by a metal oxide film, a film containing carbon as a main component, a surface-modified film or the like.

23 Claims, 19 Drawing Sheets

MICROLENS, SOLID STATE IMAGING DEVICE, AND PRODUCTION PROCESS THEREOF

BACKGROUND OF THE INVENTION

1. Field of the Invention

The present invention relates to a microlens, in particular, a solid state imaging device including a microlens on the top of its photoreceiving portion where photoelectric conversion is performed, and to a production method thereof.

2. Related Background Art

A microlens is being used in various optical systems. The optical systems include, for example, a solid state imaging device. The solid state imaging device is now in the process of development toward miniaturization of its integrated circuit chip and arrangement of a larger number of pixels on the same so as to meet demand for high resolution images and miniaturized photographing systems. In order to accomplish miniaturization of the chip as well as the arrangement of a larger number of pixels on the same, it is imperative to reduce each pixel size, and a highly sensitive photoelectric converter, an improved S/N, and a larger aperture width are being investigated so as to compensate for the decrease in an electrical output signal accompanying the reduction of the photoreceiving area.

A microlens has been devised in order to allow the aperture width of each pixel in an imaging device to be larger, and the aperture rate of the imaging device can be raised substantially by condensing the light entering a given pixel efficiently into the photoreceiving portion with the microlens. One microlens is provided for each pixel on the top of the photoreceiving portion of the imaging device in such a manner as to correspond to each photoreceiving portion (refer to European Patent Publication No. 948055).

Generally, a photolithographic process is used as the process for forming a microlens. The production process is as follows: first, the top of an imaging device, which includes a photoreceiving portion, is planarized with a transparent resin; second, the photosensitive resin, which is to be a microlens at a final stage, is shaped into islands by photolithography in such a manner that the islands correspond to respective pixels; third, the island-shaped resin pattern is heated and softened so that the surface tension makes its surface spherical; and lastly, the spherical resin patter is set to be a microlens.

FIG. 24 shows a cross-sectional view of a solid state imaging device of the prior art.

On a semiconductor substrate 11, formed are photoelectric converters 1, vertical CCD resisters 12, channel stops 13 and transfer gate areas 14. The semiconductor substrate 11 includes gate dielectric films 16, transfer electrodes 15, light screen films 17, layer to layer insulation thin films 18 and a cover layer 19 on its surface.

On the cover layer 19, formed is a transparent resin layer 2, and on top of that, a microlens array 3 is formed.

In this solid state imaging device, since the interface of the microlens resin with a high refractive index is exposed, the reflection loss of the incident light is large.

As a measure to improve this point, there is disclosed a method of forming an antireflection film of, for example, aluminum fluoride on the surface of the microlens in Japanese Patent Application Laid-Open No. 10-150179.

After performing a large number of experiments repeatedly, the present inventors found that the solid state imaging devices of the prior art potentially have the problems to be resolved as described below.

Specifically, in the solid state imaging devices of the prior art, since the surfaces of their microlenses are formed of a highly insulating polymer etc., these surfaces are easy charged. Therefore, dust particles are likely to adhere thereto. Moreover, since the topmost surface of the solid state imaging devices is rough due to the presence of microlenses, removing dust particles adhering thereon is difficult; and, if the pixels are allowed to be even finer, removing dust particles becomes more difficult. These problems are not specific only to the solid state imaging devices.

SUMMARY OF THE INVENTION

Accordingly, one of the objects of the present invention is to provide a microlens and a solid state imaging device, both of which can be prevented from being charged and thereby the adhesion of dust particles thereon can be inhibited, and a production process thereof.

Another object of the present invention is to provide a microlens characterized by a conductive surface, a solid state imaging device including the above microlens, and a production process thereof.

Still another object of the present invention is to provide a production process of a microlens or a solid state imaging device characterized by including:

a step of forming a resin pattern on the top of a substrate;

a step of forming the above resin pattern;

a step of irradiating the above shaped resin pattern with ultraviolet rays and heat-treating the same; and a step of changing the surface of the above resin pattern into a conductive surface.

According to an aspect of the present invention, there is provided a microlens, wherein a surface of the microlens is a conductive surface.

According to another aspect of the present invention, there is provided a method for producing a microlens, comprising the steps of:

forming a resin pattern on or above a substrate;

forming the resin pattern;

irradiating the formed resin pattern with ultraviolet while subjecting a heat treatment to the formed resin pattern; and then altering a surface of the resin pattern into a conductive surface.

According to another aspect of the present invention, there is provided a microlens, a surface of which is coated with a light transmitting conductive film and a light transmitting low-refractive-index film with a refractive index lower than that of a component of the microlens.

According to another aspect of the present invention, there is provided a method for producing a microlens, comprising the steps of:

forming a resin pattern on or above a substrate;

forming the resin pattern;

irradiating the formed resin pattern with ultraviolet while subjecting a heat treatment to the formed resin pattern; and then forming a light transmitting conductive film and a low-refractive-index film with a refractive index lower than that of a component of the microlens.

According to another aspect of the present invention, there is provided a solid state imaging device comprising a photoreceiving portion for performing a photoelectric conversion and a microlens provided on the photoreceiving portion, wherein a surface of the microlens is a light transmitting conductive surface.

According to another aspect of the present invention, there is provided a method for producing the above-described solid state imaging device, comprising the steps of:

forming a resin pattern, which is to be the microlens, on or above the photosensitive portion;

forming the resin pattern;

irradiating the formed resin pattern with ultraviolet while subjecting a heat treatment to the formed resin pattern; and then altering a surface of the resin pattern into a conductive surface.

According to another aspect of the present invention, there is provided a solid state imaging device comprising a photoreceiving portion for performing a photoelectric conversion and a microlens provided on the photoreceiving portion, wherein a surface of the microlens is coated with a light transmitting conductive film and a low-refractive-index film with a refractive index lower than that of a component of the microlens.

According to another aspect of the present invention, there is provided a method for producing the just above-described solid state imaging device, comprising the steps of:

forming a resin pattern to be the microlens on or above the photoreceiving portion;

forming the resin pattern;

irradiating the formed resin pattern with ultraviolet while subjecting a heat treatment to the formed resin pattern; and then forming the light transmitting conductive film and the low-refractive-index film.

DETAILED DESCRIPTION OF THE PREFERRED EMBODIMENTS

Figure 1:
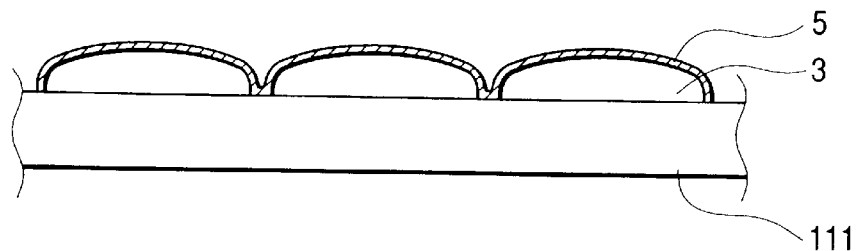
FIG. 1 is a schematic view in section of a microlens in accordance with one embodiment of the present invention.

Referring to FIG. 1, there is shown a cross-sectional view of a microlens in accordance with one embodiment of the present invention. In the figures other than FIG. 1, portions equal to those of FIG. 1 shall be denoted by the same numeral references.

On the surface of a substrate 111 a plurality of microlenses 3, of which surface is conductive, are arranged in an array.

In this case, a microlens having a conductive surface exposed to air is obtained by providing the microlens with a light transmitting conductive film 5, which gives the microlens a conductive surface.

The substrate 111 for use in the present invention may be glass, resin, or a semiconductor chip, as described later, on which a solid state imaging device has been formed.

The conductive film 5 for use in the present invention is preferably a conductive film capable of transmitting the light having permeated the microlens 3. The concrete examples include, for example, an oxide conductor such as indium-tin oxide, a conductive film of which main component is carbon, such as a diamond-like carbon thin film (DLC), or a surface-modified thin film obtained by modifying the surface of a microlens so as to allow its sheet resistance to be low.

An undercoat layer (undercoat thin film) may be formed between the conductive film 5 and the microlens 3, and in this case, a thin film with a low refractive index as described later is preferably used.

The resin for use in the microlens of the present invention can be selected from the group consisting of polystyrene resin, acrylic resin, polyolefin resin, polyimide resin, polyamide resin, polyester resin, polyethylene resin, novolak resin and so forth.

When adopting the hot forming method for forming the microlens, thermoplastic resin is preferably used. This is, however, not necessarily true when adopting the forming method utilizing etching or a die.

As the forming method of the microlens, the methods can be adopted which are disclosed in Japanese Patent Application Laid-Open No. 11-151758, Japanese Patent Application Laid-Open No. 11-153704, Japanese Patent Application Laid-Open No. 2000-108216, Japanese Patent Application Laid-Open No. 2000-266909 and Japanese Patent Application Laid-Open No. 2000-307090.

The sheet resistance of the conductive surface suitable for the microlens of the present invention is less than $10^6$ Ω/square, and the minimum value is not particularly limited.

The concrete examples of the sheet resistance obtained by the embodiments described later are less than $10^6$ Ω/square and 10 Ω/square or more.

Desirably, the conductive film 5 is provided in such a manner as to come in contact with both the surface of the microlens 3 and the surface of the substrate between the two adjacent microlenses 3 and to coat the same.

According to the present invention, a light transmitting conductive film prevents the surface of the solid state imaging device from being charged, thereby adhesion of dust particles on the same can be prevented.

In the following, a microlens in accordance with one embodiment of the present invention will be described in connection with a solid state imaging device of the present invention.

Figure 2:
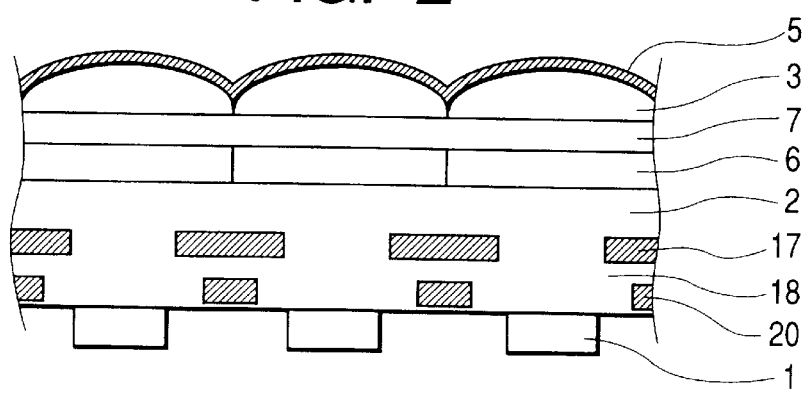
FIG. 2 is a schematic view in section of a solid state imaging device in accordance with one embodiment of the present invention.

Referring to FIG. 2, there is shown a schematic view in section of a solid state imaging device in accordance with one embodiment of the present invention. In the same figure, reference numeral 1 denotes a photoreceiving portion as a photoelectric converter, such as photodiode and phototransistor, numeral 2 a planarizing film which is formed on a rough surface formed of electrodes or wiring for providing a planar surface, numeral 3 a microlens for condensing light beam, numeral 6 a color filter with a combination of color layers each showing the color selected from red (abbreviated R), green (G), blue (B), yellow (Y), cyan (C) and magenta (M), and numeral 7 a planarizing film formed on the color filter 6. In this case, the substrate of the microlens is a chip of the solid state imaging device which includes the planarizing film 7.

Reference numeral 17 denotes a shielding film formed so as to prevent light from entering the portions other than the photoreceiving portions, numeral 18 a layer to layer insulation thin film provided between the vertically adjacent wiring and between the wiring and the shielding film, and numeral 20 an electrode or wiring.

In this embodiment, a light transmitting conductive film 5 is provided on the surface of the microlens 3, thereby the microlens is hard to charge. Thus, the adhesion of dust particles on the microlens 3 can be prevented.

The light transmitting conductive film 5 can be formed of a conductor or a low-resistant semiconductor with transmittance necessary for the light (electromagnetic wave) to be received by the photoreceiving portion 1. Specific materials include, for example, conductive metal oxides such as tin oxide, indium oxide, ITO (indium-tin oxide), zinc oxide, CTO (cadmium-tin oxide), and iridium oxide. Metal thin films such as gold can also be used. Further, the light transmitting conductive film 5 may be a film the main component of which is carbon, such as a diamond-like carbon thin film, or a surface-modified layer obtained by irradiating the surface of the microlens with ions.

Preferably, the thickness of the light transmitting conducive film 5 is selected so as to be in the range of 1 nm to 200 nm, though it depends on the material used. In order to suppress the light reflection on the surface of the microlens, preferably the thickness is in the range of 1 nm to 20 nm, more preferably in the range of 1 nm to 10 nm.

The solid state imaging devices for use in the present invention include, for example, known imaging devices for sensing such as a CCD imaging device, a CMOS imaging device and a bipolar imaging device.

In the following, a production process of the microlens will be described with reference to FIGS. 3A, 3B and 3C. For the color filter 6 and the structure below the same, those that can be formed by the known semiconductor device production processes and color filter production processes can be used. Therefore, the detailed description shall be omitted.

After forming the color filter 6, in order to fill up the concave portions on the surface of the color filter 6 and planarize the same, the planarizing film 7 is formed on the surface thereof by coating the surface with acrylic resin, etc.

Figure 3A:
FIGS. 3A, 3B and 3C are schematic views in section illustrating a production process of a solid state imaging device in accordance with one embodiment of the present invention.

As shown in FIG. 3A, a film of photosensitive resin composition is formed on the surface of the planarizing film 7, and after the film is subjected to patterning into a rectangular or circular pattern 3a by the photolithography, the entire surface of the resin having subjected to patterning is irradiated with ultraviolet rays so as to bleach the photosensitive component.

Figure 3B:

Then, as shown in FIG. 3B, the resin pattern 3a, which is in the form of an island, is hot-melted through heat treatment (depending on the type, the photosensitive resin does not necessarily exhibit photosensitivity at the time of heat treatment). At this point, the surface of the resin island is curved with its convex surface facing up, due to surface tension of its own. The microlens 3, for example, in the form of a convex lens is formed utilizing such a phenomenon.

Then the formed resin, that is, the microlens 3 is heat-treated so as to remove the volatile component contained therein and enhance the physical strength and heat resistance of the microlens while being irradiated with ultraviolet rays. The polymer constituting the resin is thermoset three-dimensionally through this treatment. The ultraviolet ray source used is such that it is capable of emitting light containing far-ultraviolet light of wavelength 300 nm or less as well. Preferably, both irradiation with ultraviolet and heat treatment are performed in the atmosphere of an inert gas such as nitrogen and argon, so that the microlens should not be oxidized and its properties should not be changed.

Figure 3C:
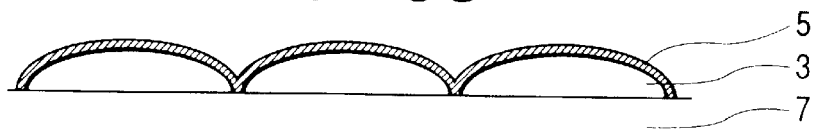

Then, as shown in FIG. 3C, a conductive film is formed on the surface of the microlens by the vacuum evaporation, ion beam evaporation, ion plating or sputtering process and so forth. Preferably the film-forming temperature is 250° C. or lower, more preferably 200° C. or lower.

Thus, a solid state imaging device with the microlenses in accordance with this embodiment can be produced. So far, the microlens in accordance with this embodiment has been described in terms of the case where a photosensitive resin is used as the starting material; however, a non-photosensitive resin may be used as long as it can be melted.

In order to simply protect the surface of the microlens, the surface has only to be provided with a protective film. However, in order to increase the numerical aperture of the microlens as much as possible and introduce incident light in a wide angle range, the refractive index of the medium in contact with the curved surface of the microlens is required to be as small as possible. Accordingly, it is difficult in actuality to form a thick protective film on the surface of the microlens.

When forming a thin and strong protective film on the surface of the microlens, in order to prevent the loss of light quantity which occurs on the surface of the microlens due to the reflection of incident light, the prevention of surface reflection becomes a key point.

According to this embodiment, the surface of the microlens can be inhibited from being charged by forming a light transmitting conductive film thereon. In addition, the surface reflection on the microlens can be reduced by setting the thickness of the conductive film properly according to the situation, as described above.

The thickness of the conductive film suitable to reduce the surface reflection can be determined based on the experiment 1 described below.

Experiment 1

Figure 4:
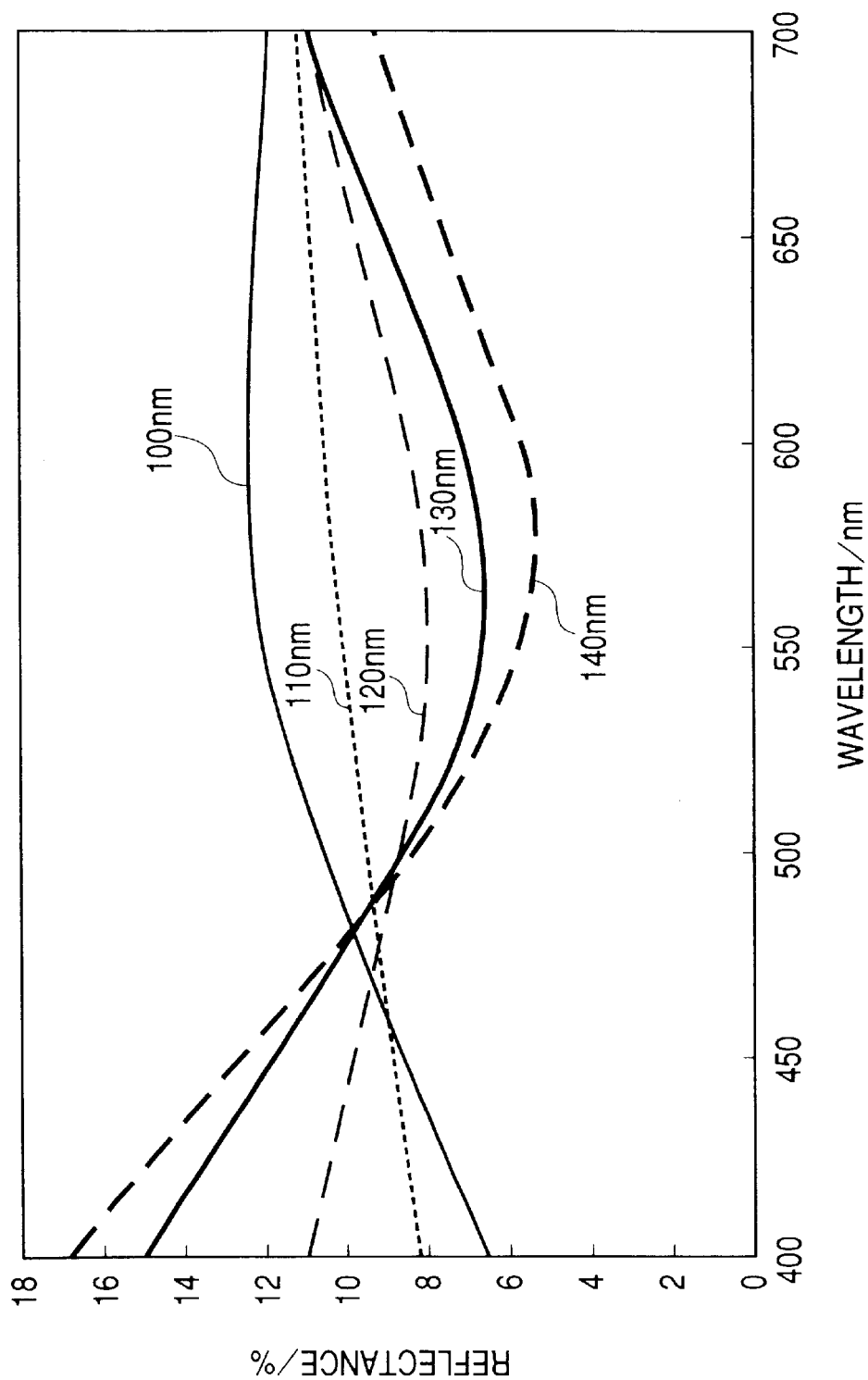
FIG. 4 is a graph showing the spectral reflection characteristics of samples with a conductive film.

Five samples in all were prepared which consisted of a non-alkali glass substrate, a resin film of the same material as that of the microlens formed on the substrate, and an ITO film 100 nm to 140 nm thick formed on the resin film by the sputtering process. The spectral reflectance of the surface of each sample was measured. In the measurement, the spectral reflectance components originating from lights reflected on the portions other than the interface between the ITO film and the resin were measured separately, and the values of the components were subtracted from the measured value of the spectral reflectance. The relationship between the spectral reflectance and the ITO film thickness for each sample is shown in FIG. 4.

Further, six samples in all were prepared which consisted of a non-alkali glass substrate, a resin film of the same material as that of the microlens formed on the substrate, and an ITO film 1 nm to 30 nm thick formed on the resin film by the sputtering process. The spectral reflectance of the surface of each sample was measured. In the measurement, the spectral reflectance components originating from lights reflected on the portions other than the interface between the ITO film and the resin were measured separately, and the values of the components were subtracted from the measured value of the spectral reflectance. The relationship between the spectral reflectance and the ITO film thickness for each sample is shown in FIG. 5.

Figure 5:
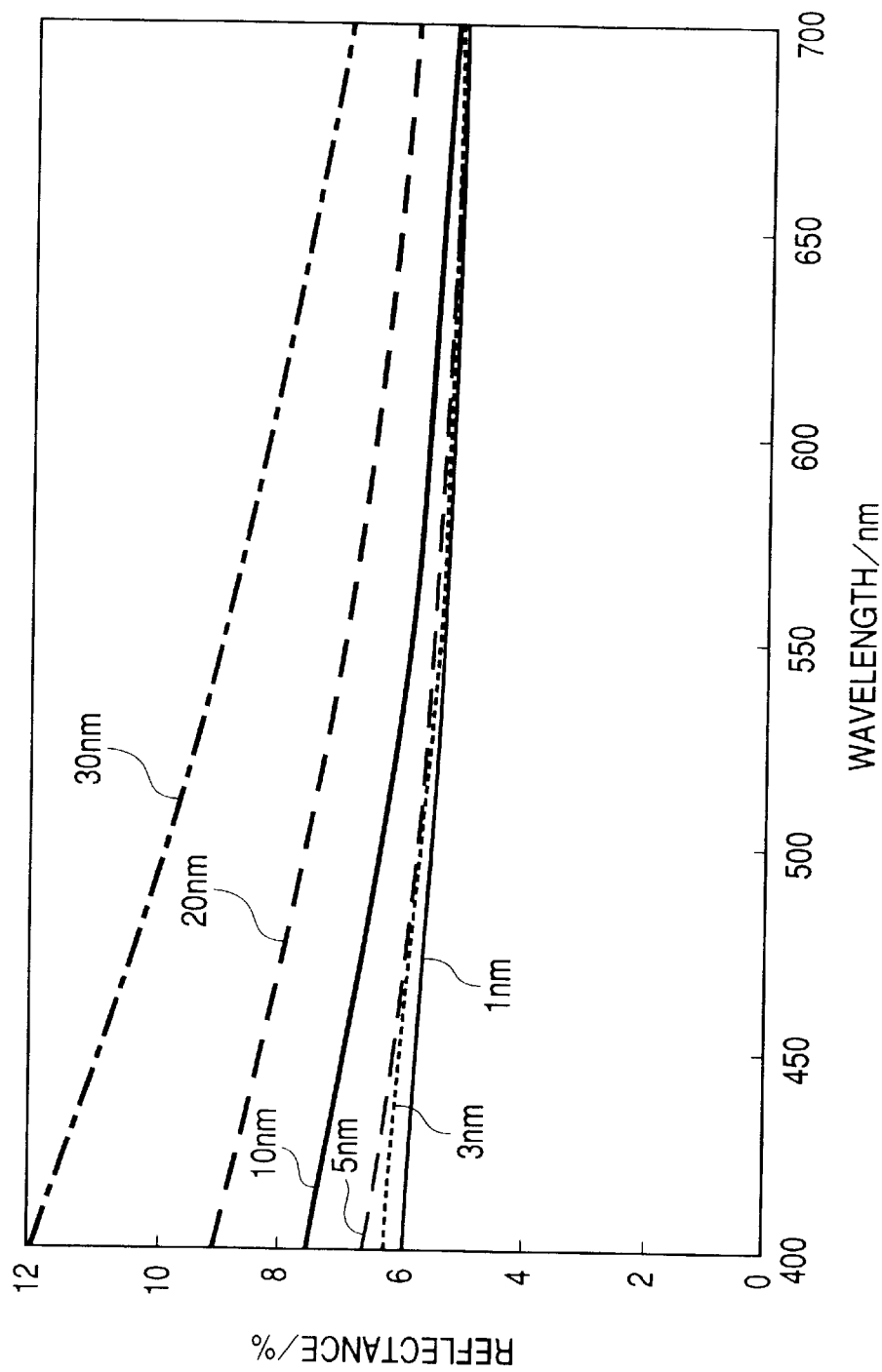
FIG. 5 is a graph showing the spectral reflection characteristics of samples with a conductive film.

As is evident from FIG. 5, when the thickness of the ITO film was 1 to 5 nm, the reflectance was about 6% or less throughout bandwidth of visible rays. Since the spectral reflectance of the surface of the microlens material before the formation of the ITO film was 5.2% to 6.0% in the bandwidth of 400 nm to 700 nm, the increase in reflectance due to the formation of the ITO film was about 1% or less.

In the case of a reference sample which had an ITO film with a thickness ($\lambda/4$ film) equivalent to the antireflection requirements computed by the optical computing formed on its resin film, the reflectance in the entire area of visible rays was higher than 10%. Accordingly, it can be said that, for samples having an ITO film of 1 nm to 20 nm in thickness, their reflectance at the visible wavelengths was satisfactorily low compared with the reference sample.

For samples having an ITO film of 5 nm or less in thickness, since the reflectance was much lower in the entire area of visible rays, a good process margin can be provided for the variations in film thickness. This is very advantageous in terms of the production process of microlenses.

There was no apparent degradation of optical characteristics of the microlens itself even though a light transmitting conductive film was provided thereon.

The adhesion of dust particles on the surface of the microlens must be avoided as much as possible because it is directly connected with bad products. Moreover, when reducing the pixel size so as to achieve the miniaturization of chips and arrangement of a larger number of pixels on a single chip, the size of the dust particles affecting the image sensing results becomes small as the pixel size reduces. Accordingly, the microlens should have a construction such that it does not allow even fine dust particles to adhere thereon easily, in addition, even if dust particles adhere thereon, it allows them to be removed easily through cleaning.

In Experiment 2 described below, the resistance to influence with cleaning of the microlens was examined.

Experiment 2

The resistance to influence with cleaning of the samples prepared in the experiment 1 was examined by steeping them in various types cleaning fluids. And it was found that they had sufficient resistance to commonly used organic solvents, nonionic surface active agents and water.

As described in detail above, according to the solid state imaging device of this embodiment, the surface of the microlenses is allowed to be conductive, thereby the adhesion of dust particles due to static electricity can be prevented. In addition, if the thickness of the light transmitting conductive film is selected properly as described above, the surface reflectance can be restricted to almost the same level as that of the microlens without such a conductive film.

Further, according to the production process of the solid state imaging device of this embodiment, the microlenses are subjected to UV curing treatment before forming a light transmitting conductive film thereon, thereby the volatile component of the microlenses themselves can be removed and the heat resistance and mechanical strength of the same can be enhanced. As a result, the allowable film forming temperature at the time of conductive film formation can be increased. The increased film-forming temperature enables the improvement of the conductive film both in quality and in adhesion to the surface of the microlenses. Furthermore, due to the enhanced mechanical strength of the microlenses themselves, their resistance to influence of cleaning is improved as well.

Embodiment 2

The following embodiment of the present invention is a solid state imaging device including a photoreceiving portion for performing photoelectric conversion and microlenses provided on the top of the photoreceiving portion, characterized in that the surface of each microlens is coated with a light transmitting conductive film as well as a low refractive index film with refractive index lower than that of the component of the above microlenses.

Figure 6:
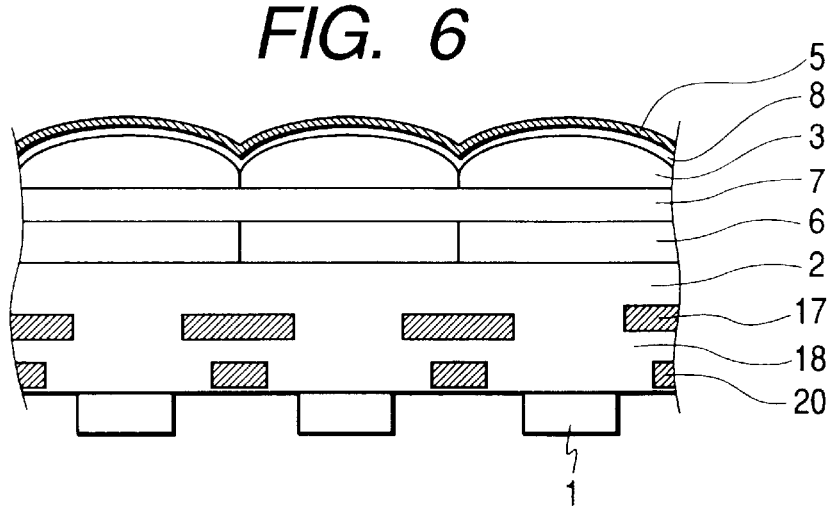
FIG. 6 is a schematic view in section of a solid state imaging device in accordance with another embodiment of the present invention.

Referring to FIG. 6, there is shown a schematic view in section of a solid state imaging device in accordance with one embodiment of the present invention. In the same figure, reference numeral 1 denotes a photoreceiving portion as a photoelectric converter, such as photodiode and phototransistor, numeral 2 a planarizing film which is formed on a rough surface formed of electrodes or wiring for providing a planar surface, numeral 3 a microlens for condensing light beam, numeral 6 a color filter with a combination of color layers each showing the color selected from red (R), green (G), blue (B), yellow (Y), cyan (C) and magenta (M), and numeral 7 a planarizing film formed on the color filter 6.

Reference numeral 17 denotes a shielding film formed so as to prevent light from entering the portions other than the photoreceiving portions, numeral 18 a layer to layer insulation thin film provided between the vertically adjacent wiring and between the wiring and the shielding film, and numeral 20 an electrode or wiring.

In this embodiment, a low refractive index film 8 with refractive index lower than that of the component of the microlens is provided on the surface of the microlens 3 for preventing the decrease in quantum efficiency due to the light reflection. Further, a light transmitting conductive film 5 is provided on the microlens 3, thereby the microlens is hard to charge. Thus, the adhesion of dust particles on the microlens 3 can be prevented.

The microlens consists of, for example, a cured photosensitive resin such as positive photoresist and its refractive index is 1.5 to 1.7.

The light transmitting conductive film 5 can be formed of a conductor or a low-resistant semiconductor with transmittance necessary for the light (electromagnetic wave) to be received by the photoreceiving portion 1. The concrete examples include, for example, tin oxide, indium oxide, ITO (indium-tin oxide), zinc oxide, CTO (cadmium-tin oxide), and iridium oxide. Metal thin films such as gold can also be used. Further, the light transmitting conductive film 5 may be a film the main component of which is carbon.

Preferably, the thickness of the light transmitting conducive film 5 is selected so as to be in the range of 1 nm to 200 nm, though it depends on the material used. In order to suppress the light reflection on the surface of the microlens, preferably, the thickness is in the range of 1 nm to 20 nm, more preferably, in the range of 1 nm to 10 nm.

Preferably, the low refractive index film 8 for use in the present invention is a film of, for example, silicon oxide, magnesium fluoride, aluminum fluoride and aluminum magnesium fluoride with the refractive index of about 1.3 to 1.5 and the thickness of 10 nm to 130 nm.

The solid state imaging devices for use in the present invention include, for example, known imaging devices such as a CCD imaging device, a CMOS imaging device and a bipolar imaging device.

In the following, a production process of the microlens will be described with reference to FIGS. 7A, 7B, 7C and 7D. For the color filter 6 and the structure below the same, those which can be formed by the known semiconductor device production processes and color filter production processes can be used. Therefore, the detailed description shall be omitted.

After forming the color filter 6, in order to fill up the concave portions on the surface of the color filter 6 and planarize the same, the planarizing film 7 is formed on the surface thereof by coating the surface with acrylic resin etc.

Figure 7A:
FIGS. 7A, 7B, 7C and 7D are schematic views in section illustrating a production process of a solid state imaging device in accordance with another embodiment of the present invention.

As shown in FIG. 7A, a film of photosensitive resin composition is formed on the surface of the planarizing film 7, and after the film is subjected to patterning into a rectangular or circular pattern 3a by photolithography, the entire surface of the resin having subjected to patterning is irradiated with ultraviolet rays so as to bleach the photosensitive component.

Figure 7B:

Then, as shown in FIG. 7B, the resin pattern 3a, which is in the form of an island, is hot-melted through heat treatment (depending on the type, the photosensitive resin does not necessarily exhibit photosensitivity at the time of heat treatment). At this point, the surface of the resin island is curved with its convex surface facing up, due to surface tension of its own. The microlens 3, for example, in the form of a convex lens is formed utilizing such a phenomenon.

Then, the formed resin, that is, the microlens 3, is heat-treated while being irradiated with ultraviolet rays so as to remove the volatile component contained therein and to enhance the physical strength and heat resistance thereof. The polymer constituting the resin is thermoset three-dimensionally through this treatment. The ultraviolet ray source used is such that it is capable of emitting far-ultraviolet rays of wavelengths of 300 nm or less as well. Preferably, both irradiation with ultraviolet light and heat treatment are performed in the atmosphere of an inert gas, such as nitrogen and argon, so that the microlens should not be oxidized and its properties should not be changed.

Figure 7C:

As shown in FIG. 7C, the low refractive index film 8 is formed on the surface of the microlens 3 by the vacuum evaporation, ion beam evaporation, ion plating or sputtering process. Preferably the film-forming temperature is 250° C. or lower, more preferably 200° C. or lower.

Figure 7D:
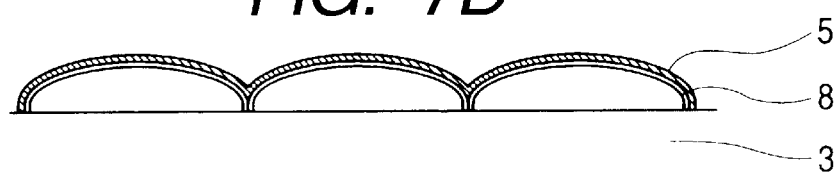

Then, as shown in FIG. 7D, the conductive film 5 is also formed on the surface of the microlens by the vacuum evaporation, ion beam evaporation, ion plating or sputtering process. Preferably the film-forming temperature is 250° C. or lower, more preferably 200° C. or lower.

Thus, a solid state imaging device with the microlenses in accordance with this embodiment can be produced.

In order to simply protect the surface of the microlens, the surface has only to be provided with a protective film. However, in order to increase the numerical aperture of the microlens as much as possible and introduce incident light in a wide angle range, the refractive index of the medium in contact with the curved surface of the microlens is required to be as small as possible. Accordingly, it is difficult in actuality to form a thick protective film on the surface of the microlens.

When forming a thin and strong protective film on the surface of the microlens, in order to prevent the loss of light quantity which occurs on the surface of the microlens due to the reflection of incident light, selecting the material of the protective film and the thickness of the same in view of the prevention of surface reflection becomes a key point.

According to this embodiment, the surface of the microlens can be inhibited from being charged by forming a light transmitting conductive film thereon, in addition, the surface reflection on the microlens can be reduced by forming a film consisting of a material with refraction index lower than that of the microlens and setting the thickness of the film properly, as described above.

The thickness of the conductive film suitable to reduce the surface reflection can be determined based on the experiments described below.

Experiment 3

Figure 8:
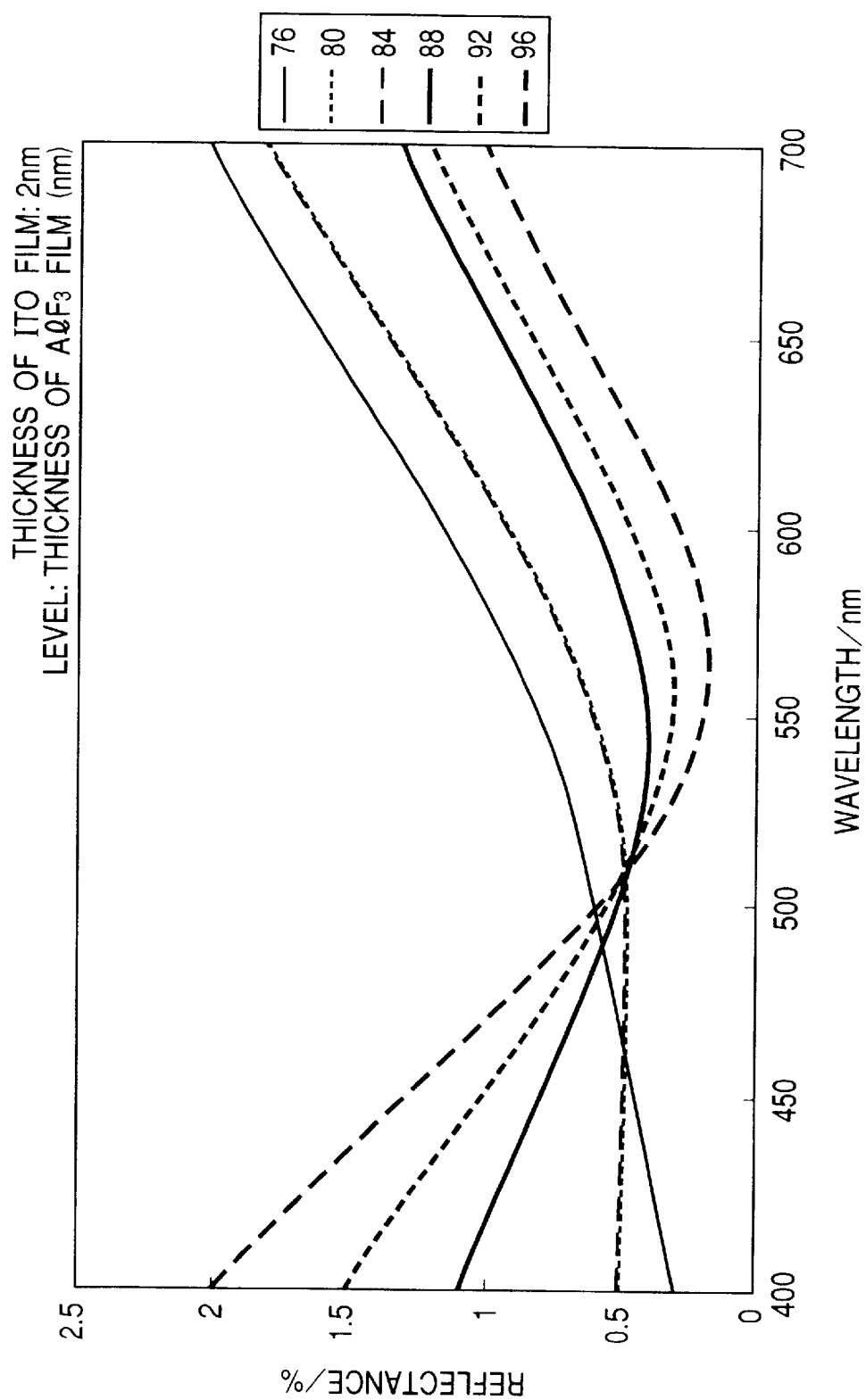
FIG. 8 is a graph showing the spectral reflection characteristics of samples with a conductive film and a low refractive index film of aluminum fluoride.

Six samples in all were prepared, which consisted of a non-alkali glass substrate, a resin film of the same material as that of the microlens formed on the above substrate, an aluminum fluoride film 76 nm to 96 nm thick formed on the resin film by the vacuum evaporation process, and an ITO film 2 nm thick formed on the aluminum fluoride film by the sputtering process. The spectral reflectance was measured of the surface of each sample. The relationship between the spectral reflectance and the thickness of the aluminum fluoride and ITO films for each sample is shown in FIG. 8.

Figure 9:
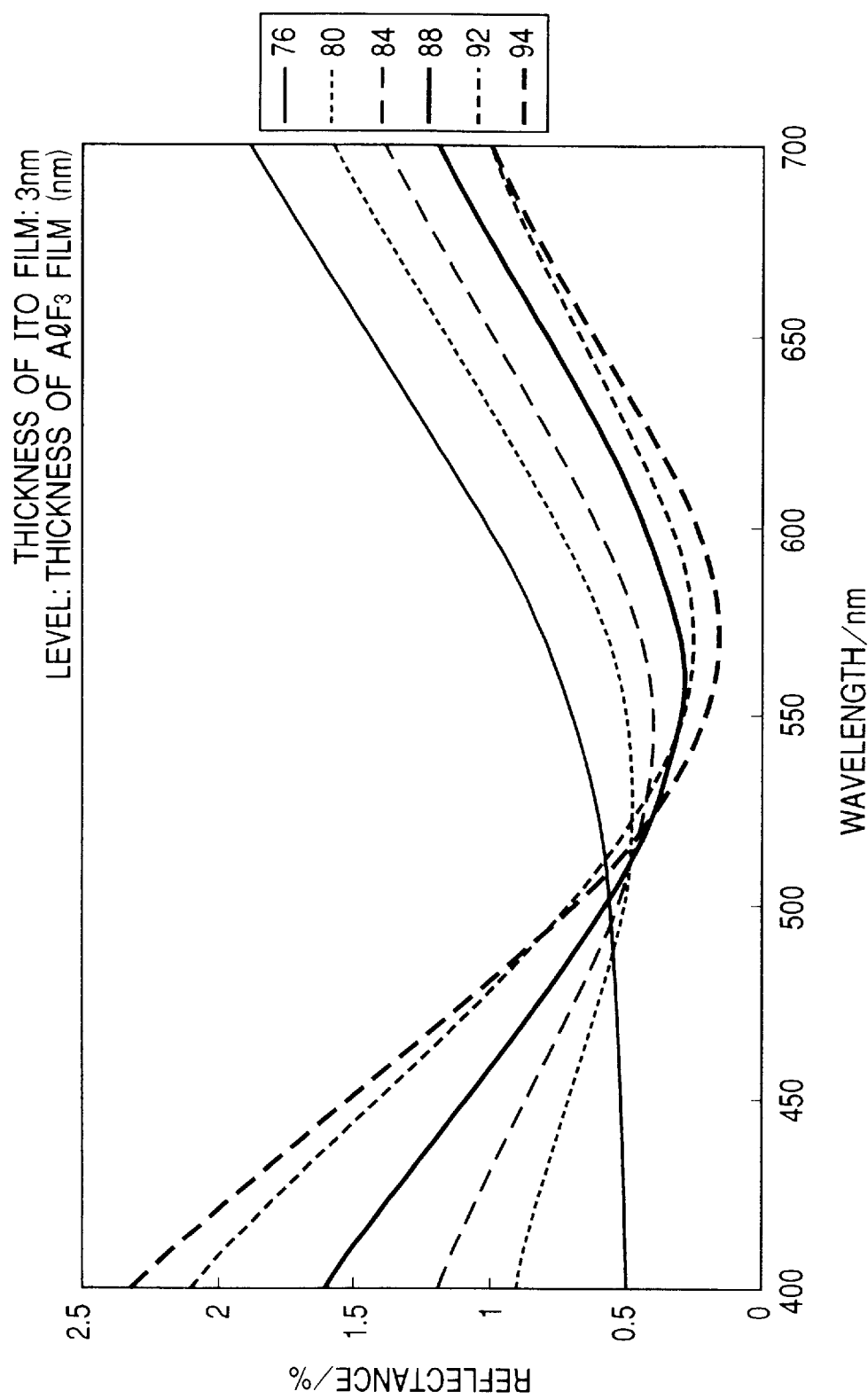
FIG. 9 is a graph showing the spectral reflection characteristics of samples with a conductive film and a low refractive index film of aluminum fluoride.

Further, six samples in all were prepared, which consisted of a non-alkali glass substrate, a resin film of the same material as that of the microlens formed on the substrate, an aluminum fluoride film 76 nm to 94 nm thick formed on the resin film by the vacuum evaporation process, and an ITO film 3 nm thick formed on the aluminum fluoride film by the sputtering process. The spectral reflectance was measured of the surface of each sample. The relationship between the spectral reflectance and the thickness of the aluminum fluoride and ITO films for each sample is shown in FIG. 9.

Figure 10:
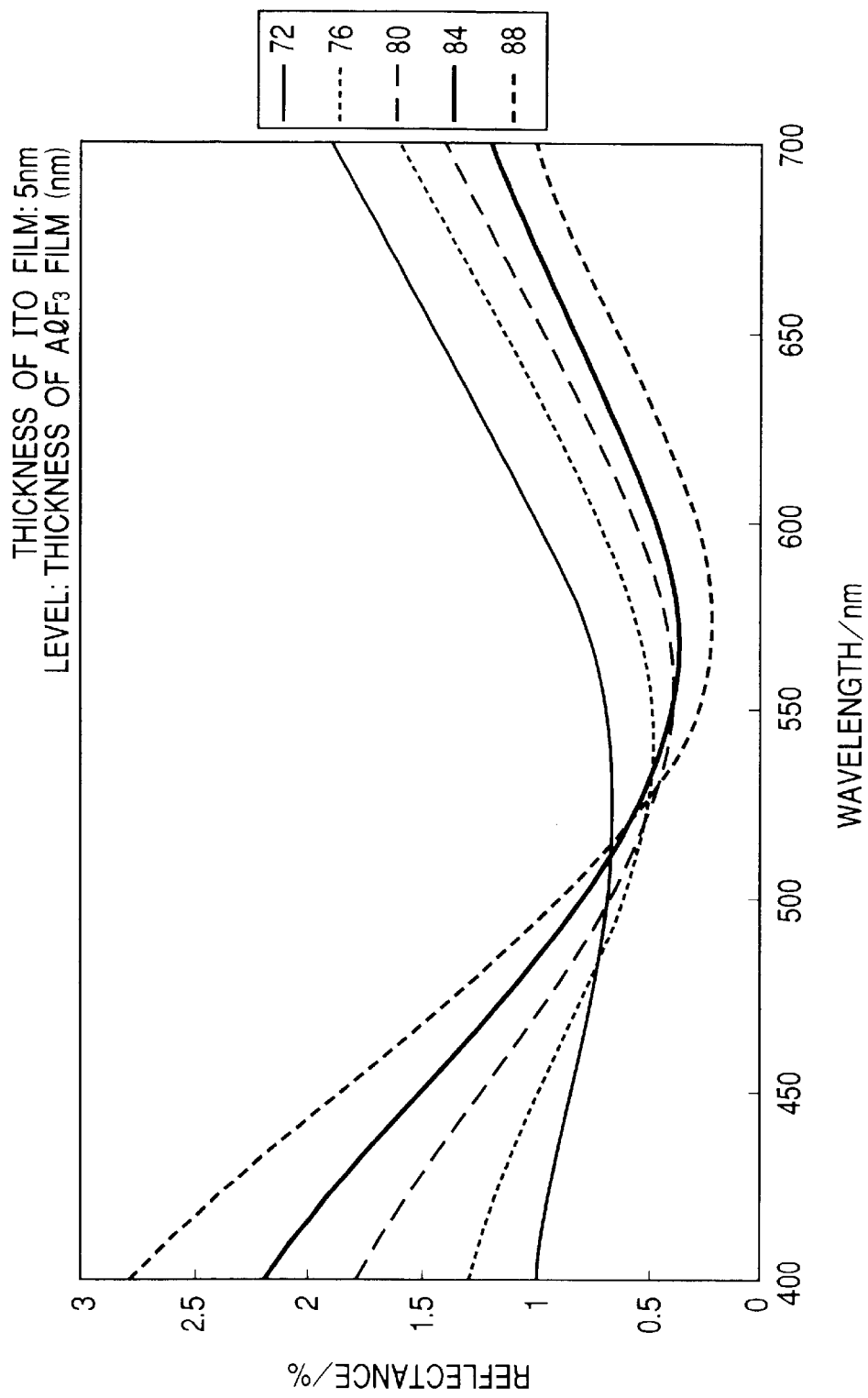
FIG. 10 is a graph showing the spectral reflection characteristics of samples with a conductive film and a low refractive index film of aluminum fluoride.

Further, five samples in all were prepared, which consisted of a non-alkali glass substrate, a resin film of the same material as that of the microlens formed on the substrate, an aluminum fluoride film 72 nm to 88 nm thick formed on the resin film by the vacuum evaporation process, and an ITO film 5 nm thick formed on the aluminum fluoride film by the sputtering process. The spectral reflectance of the surface of each sample was measured. The relationship between the spectral reflectance and the thickness of the aluminum fluoride and ITO films for each sample is shown in FIG. 10.

It is evident from these experiments that the reflectance of each sample is 2.8% or less in the entire area of visible rays (in this case 400 nm to 700 nm), it can be 1.3% or less in the entire area of visible rays if optimization is performed, and that it can be restricted to 0.2% or less at wavelength 550 nm.

Figure 11:
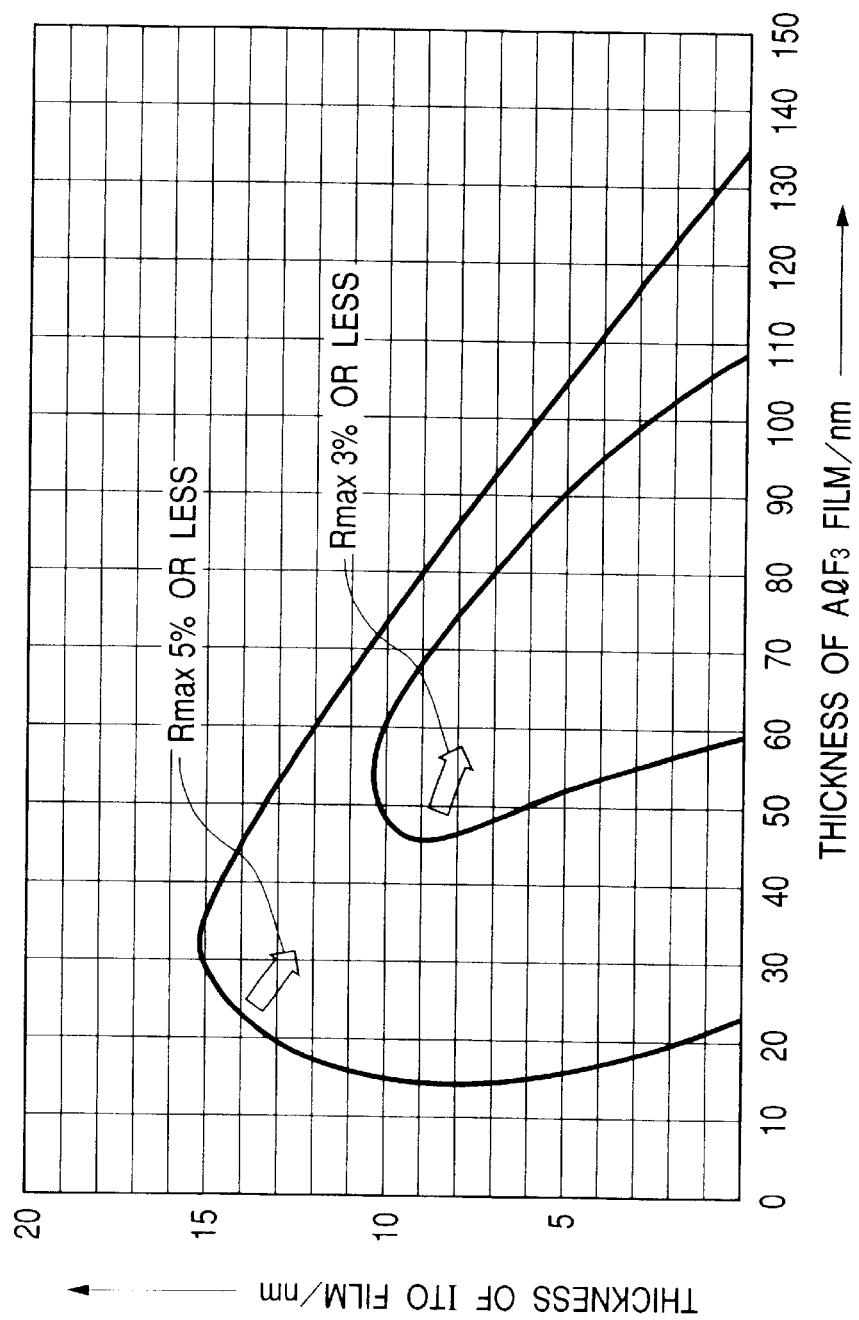
FIG. 11 is a graph showing the film thickness dependency of a conductive film and a low refractive index film of aluminum fluoride both having the maximum reflectance.

FIG. 11 shows the thickness of the aluminum fluoride and ITO films when the maximum reflectance Rmax in the entire area of visible rays is 5% and 3%. Considering the maximum reflectance of the microlens before the formation of these films is 5.2% to 6.0%, it is evident that there are a wide variety of alternatives for the film thickness allowing the maximum reflectance Rmax to be 5% or less and the number of the alternatives for the design and production of the microlens is large.

Experiment 4

Figure 12:
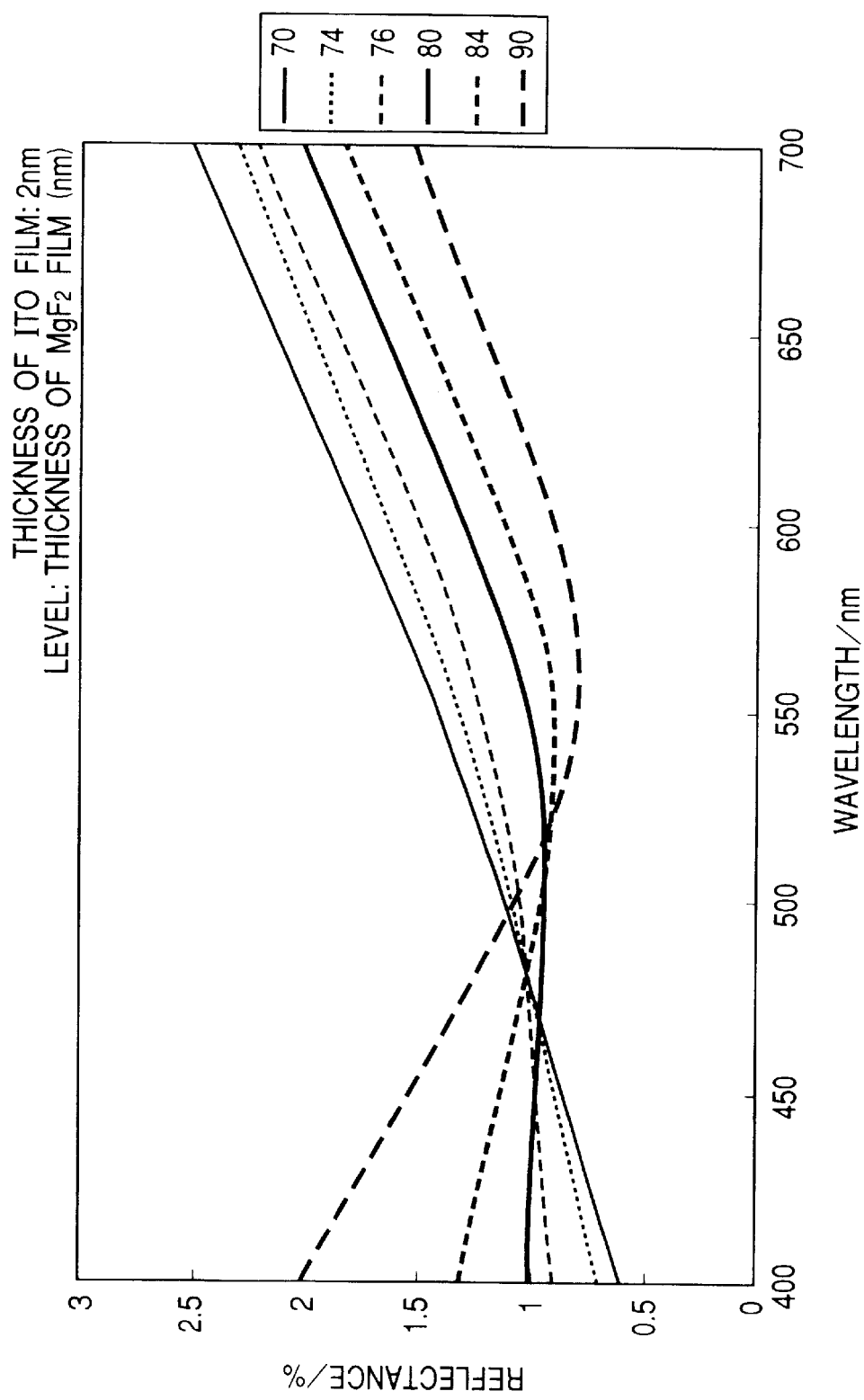
FIG. 12 is a graph showing the spectral reflection characteristics of samples with a conductive film and a low refractive index film of magnesium fluoride.

Six samples in all were prepared which consisted of a non-alkali glass substrate, a resin film of the same material as that of the microlens formed on the substrate, a magnesium fluoride film 70 nm to 90 nm thick formed on the resin film by the vacuum evaporation process, and an ITO film 2 nm thick formed on the magnesium fluoride film by the sputtering process. The spectral reflectance was measured of the surface of each sample. The relationship between the spectral reflectance and the thickness of the magnesium fluoride and ITO films for each sample is shown in FIG. 12.

Figure 13:
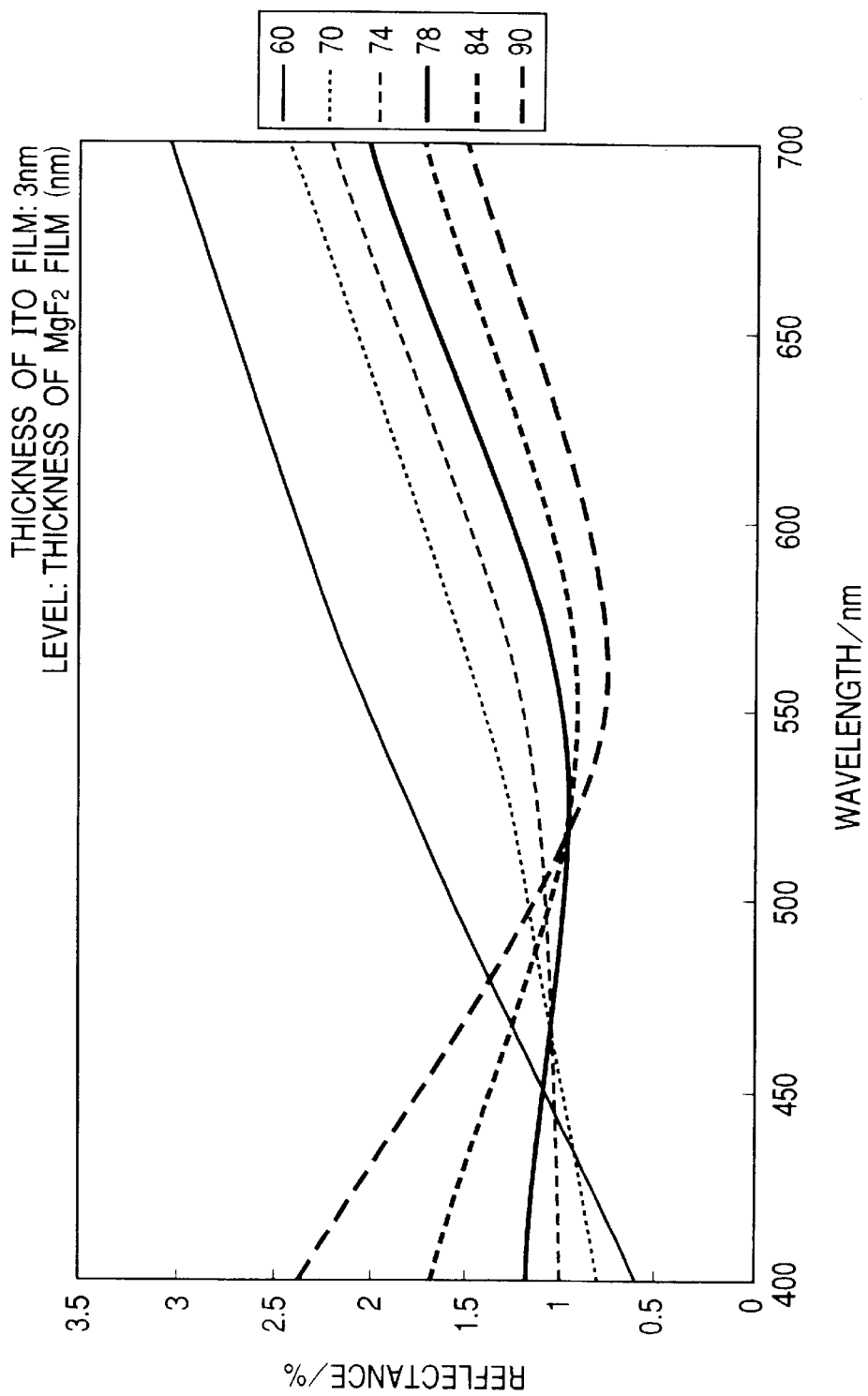
FIG. 13 is a graph showing the spectral reflection characteristics of samples with a conductive film and a low refractive index film of magnesium fluoride.

Then, six samples in all were prepared, which consisted of a non-alkali glass substrate, a resin film of the same material as that of the microlens formed on the substrate, a magnesium fluoride film 60 nm to 90 nm thick formed on the resin film by the vacuum evaporation process, and an ITO film 3 nm thick formed on the magnesium fluoride film by the sputtering process. The spectral reflectance of the surface of each sample was measured. The relationship between the spectral reflectance and the thickness of the magnesium fluoride and ITO films for each sample is shown in FIG. 13.

Figure 14:
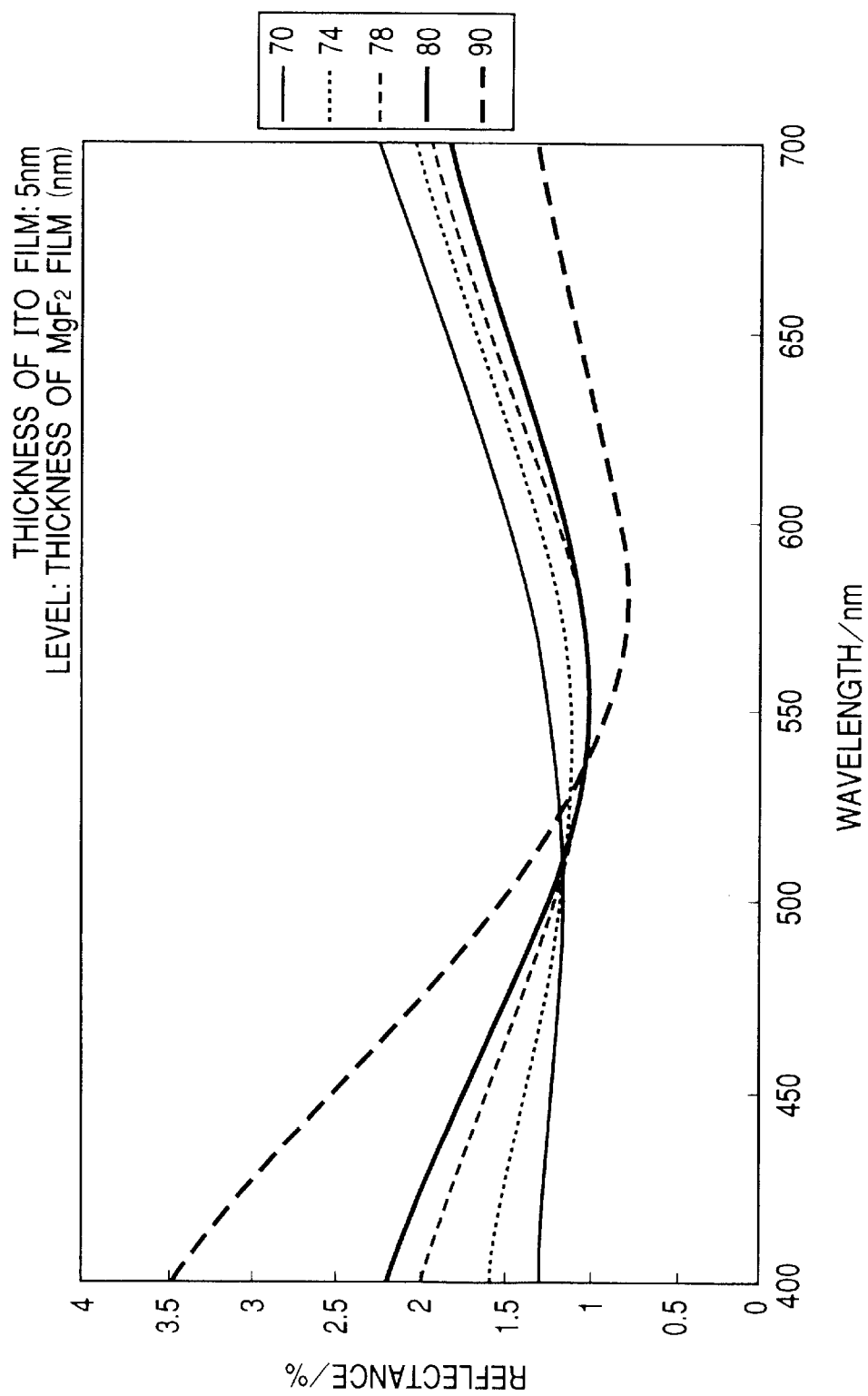
FIG. 14 is a graph showing the spectral reflection characteristics of samples with a conductive film and a low refractive index film of magnesium fluoride.

Further, five samples in all were prepared, which consisted of a non-alkali glass substrate, a resin film of the same material as that of the microlens formed on the substrate, a magnesium fluoride film 70 nm to 90 nm thick formed on the resin film by the vacuum evaporation process, and an ITO film 5 nm thick formed on the magnesium fluoride film by the sputtering process. The spectral reflectance of the surface of each sample was measured. The relationship between the spectral reflectance and the thickness of the magnesium fluoride and ITO films for each sample is shown in FIG. 14.

It is evident from these experiments that the reflectance of each sample is 3.5% or less in the entire area of visible rays (in this case 400 nm to 700 nm), it can be 1.7% or less in the entire area of visible rays if optimization is performed, and that it can be restricted to 0.8% or less at wavelength 550 nm.

Figure 15:
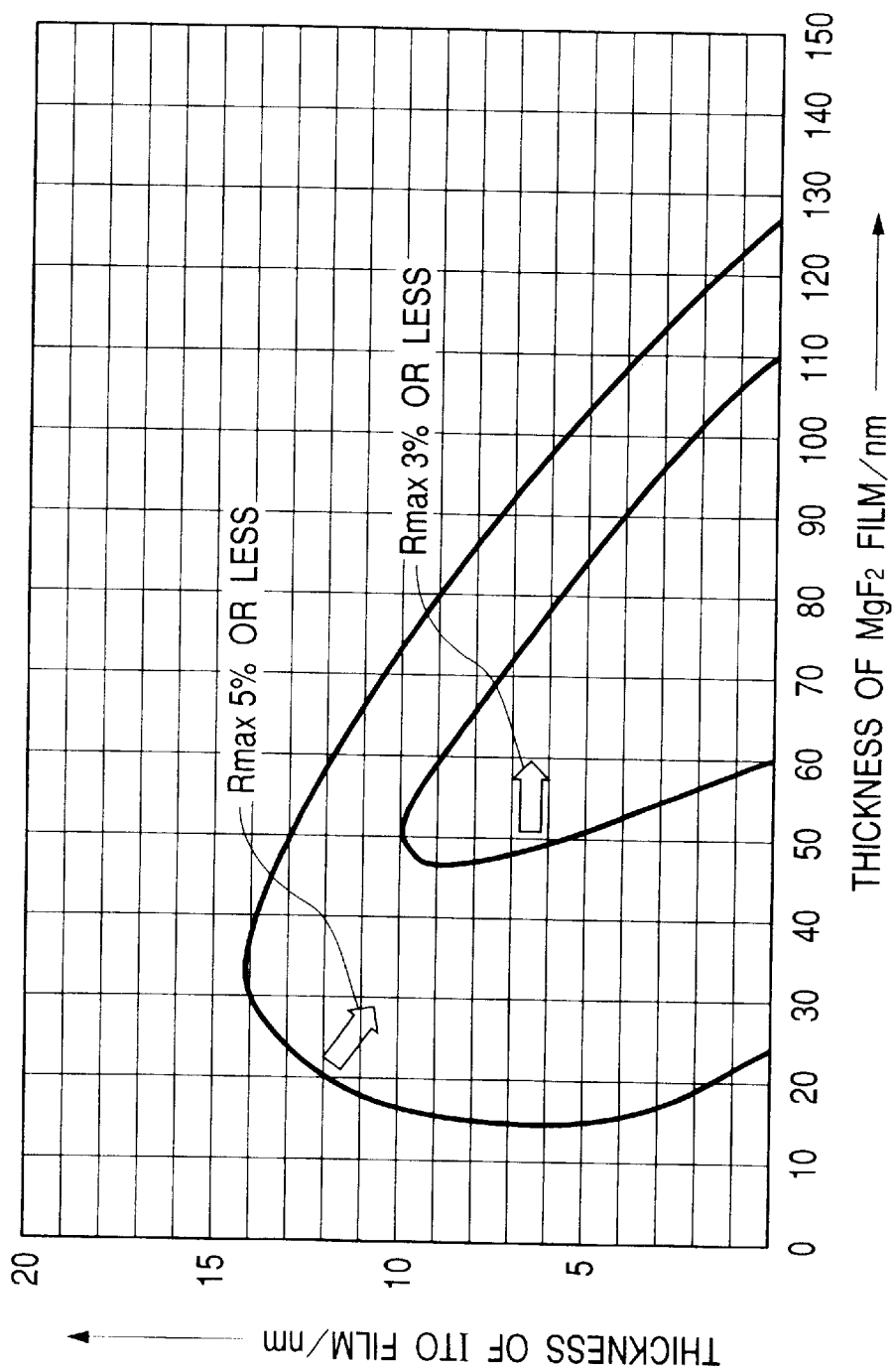
FIG. 15 is a graph showing the film thickness dependency of a conductive film a low refractive index film of magnesium fluoride both having the maximum reflectance.

FIG. 15 shows the thickness of the magnesium fluoride and ITO films when the maximum reflectance in the entire area of visible rays is 5% and 3%. Considering the maximum reflectance of the microlens before the formation of these films is 5.2% to 6.0%, it is evident that there are a wide variety of alternatives for the film thickness allowing the maximum reflectance to be 5% or less and the number of the alternatives for the design and production of the microlens is large.

Experiment 5

Figure 16:
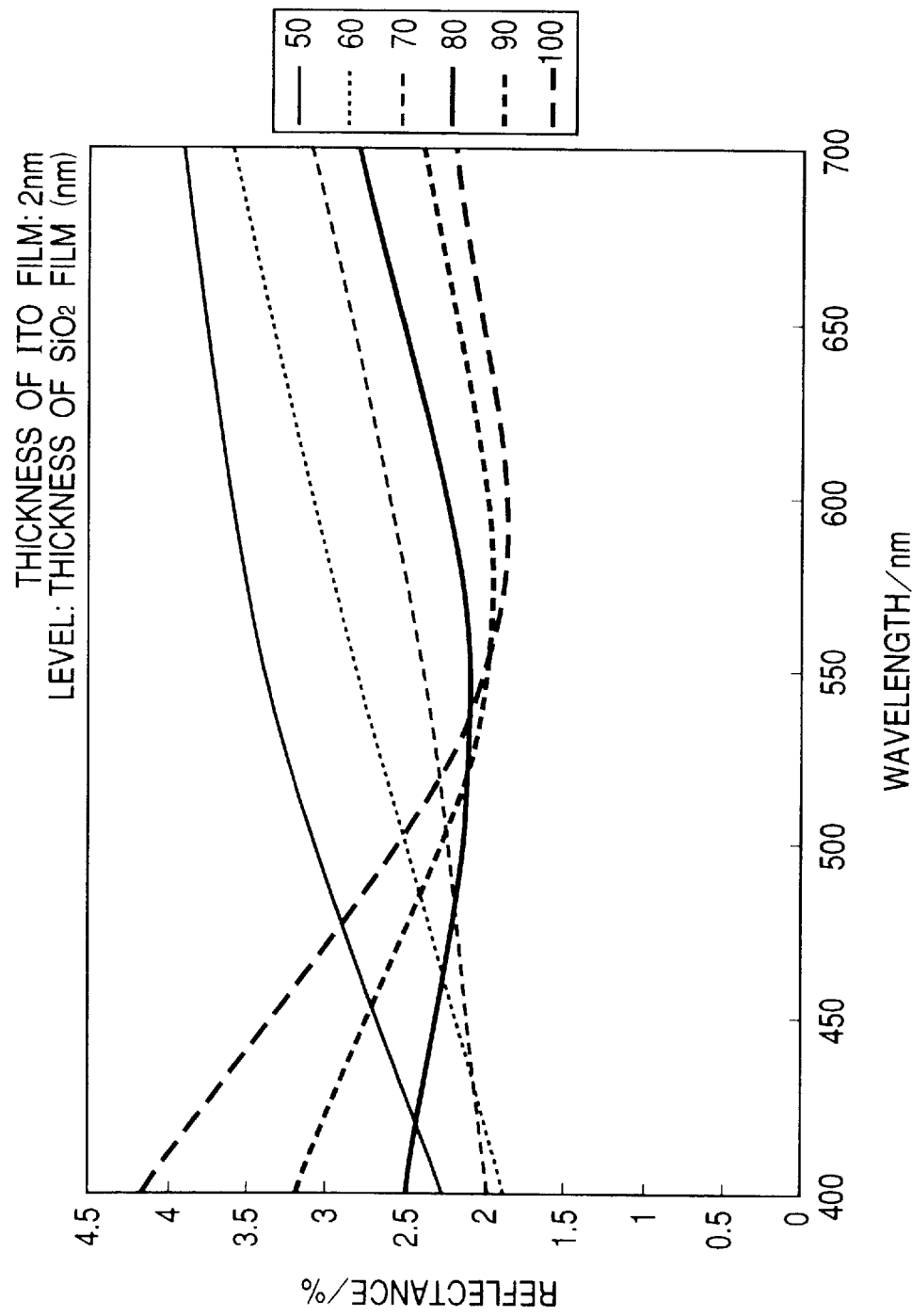
FIG. 16 is a graph showing the spectral reflection characteristics of samples with a conductive film and a low refractive index film of silicon oxide.

Six samples in all were prepared, which consisted of a non-alkali glass substrate, a resin film of the same material as that of the microlens formed on the substrate, a silicon oxide film 40 nm to 90 nm thick formed on the resin film by the sputtering process, and an ITO film 2 nm thick formed on the silicon oxide film by the sputtering process. The spectral reflectance of the surface of each sample was measured. The relationship between the spectral reflectance and the thickness of the silicon oxide and ITO films for each sample is shown in FIG. 16.

Figure 17:
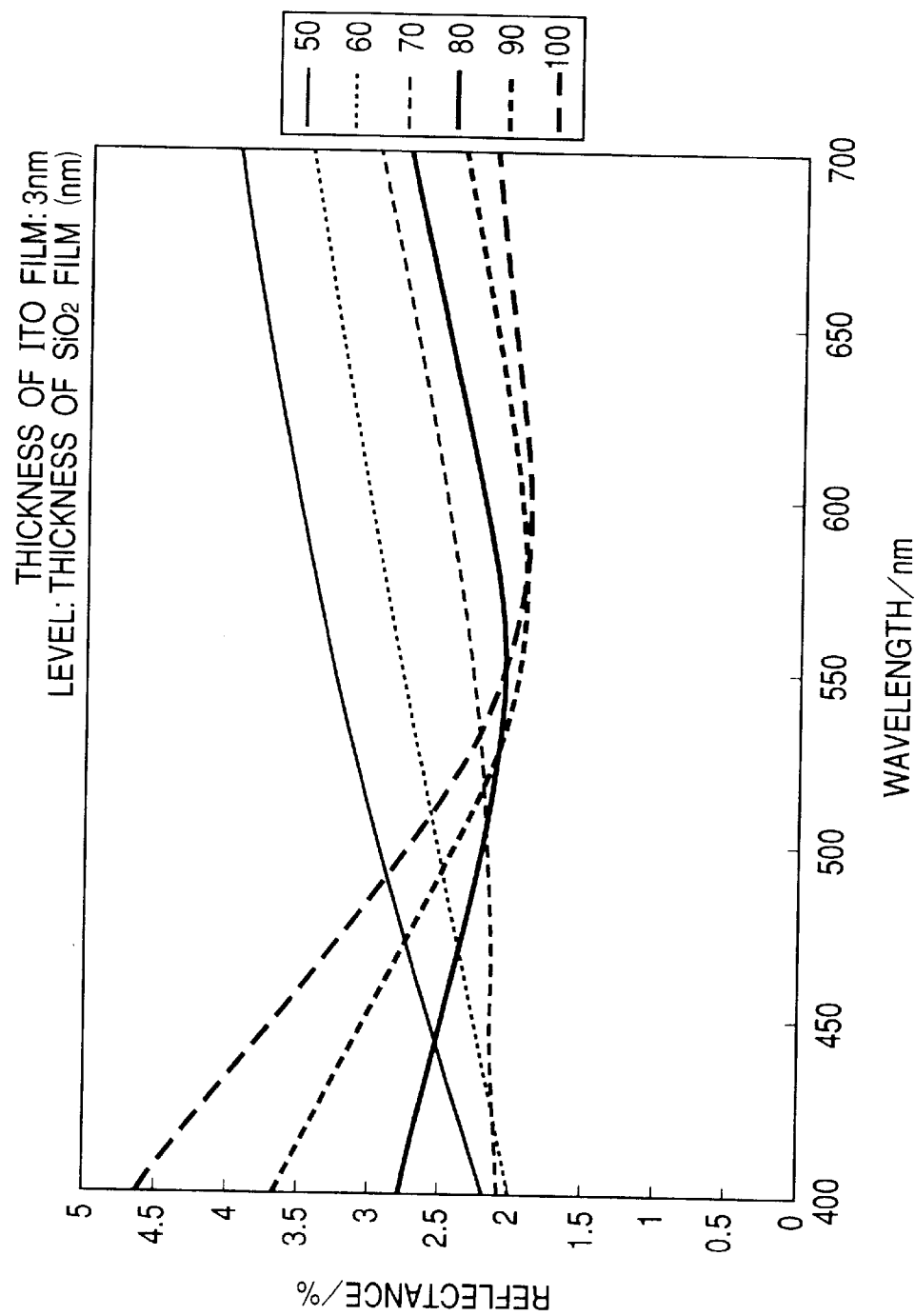
FIG. 17 is a graph showing the spectral reflection characteristics of samples with a conductive film and a low refractive index film of silicon oxide.

Then, six samples in all were prepared, which consisted of a non-alkali glass substrate, a resin film of the same material as that of the microlens formed on the substrate, a silicon oxide film 50 nm to 100 nm thick formed on the resin film by the sputtering process, and an ITO film 3 nm thick formed on the aluminum fluoride film by the sputtering process. The spectral reflectance of the surface of each sample was measured. The relationship between the spectral reflectance and the thickness of the silicon oxide and ITO films for each sample is shown in FIG. 17.

Figure 18:
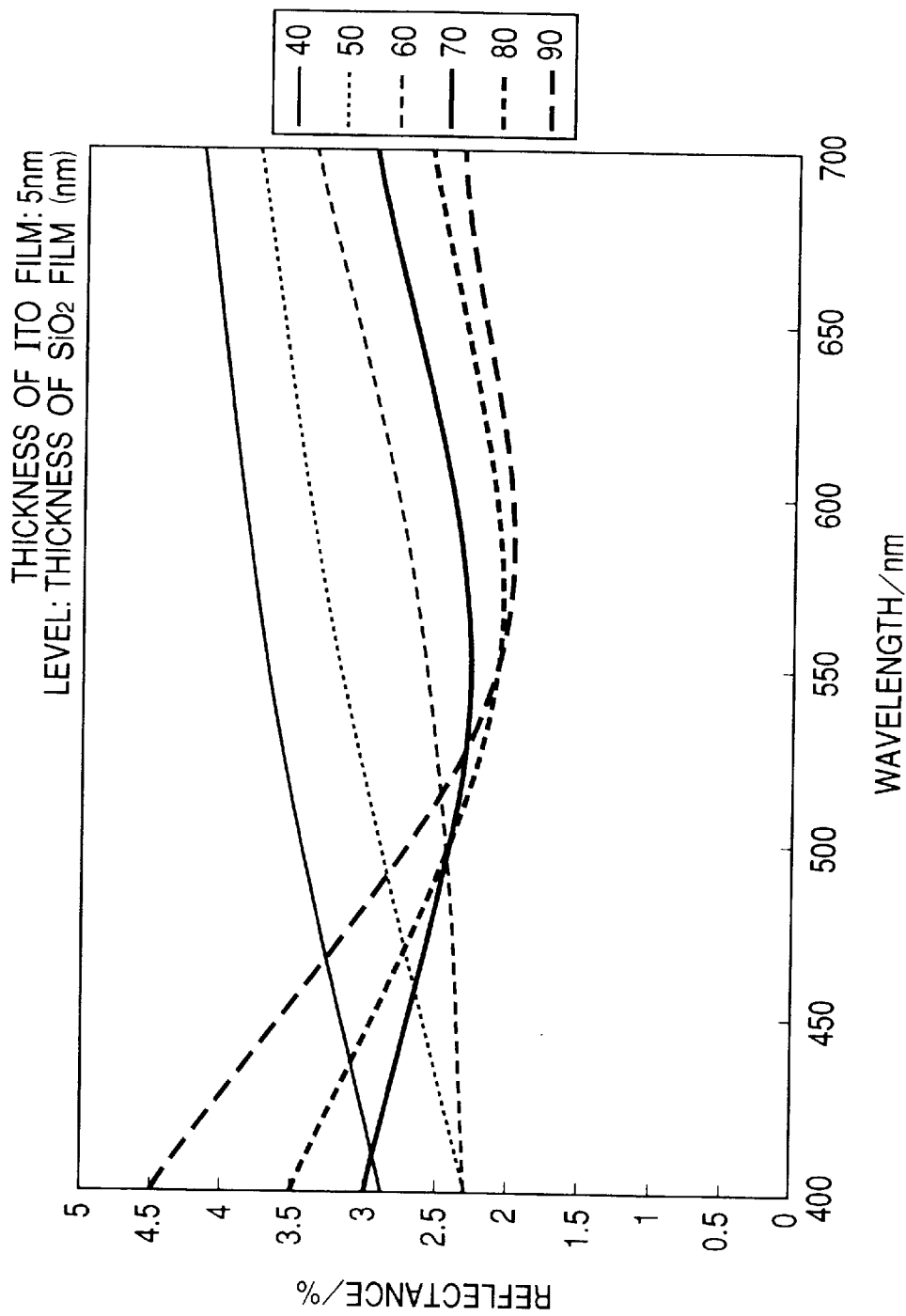
FIG. 18 is a graph showing the spectral reflection characteristics of samples with a conductive film and a low refractive index film of silicon oxide.

Further, six samples in all were prepared, which consisted of a non-alkali glass substrate, a resin film of the same material as that of the microlens formed on the substrate, a silicon oxide film 40 nm to 90 nm thick formed on the resin film by the sputtering process, and an ITO film 5 nm thick formed on the silicon oxide film by the sputtering process. The spectral reflectance of the surface of each sample was measured. The relationship between the spectral reflectance and the thickness of the silicon oxide and ITO films for each sample is shown in FIG. 18.

It is evident from theses experiments that the reflectance of each sample is 4.7% or less in the entire area of visible rays (in this case 400 nm to 700 nm), it can be 2.7% or less in the entire area of visible rays if optimization is performed, and that it can be restricted to 2.0% or less at wavelength 550 nm.

Figure 19:
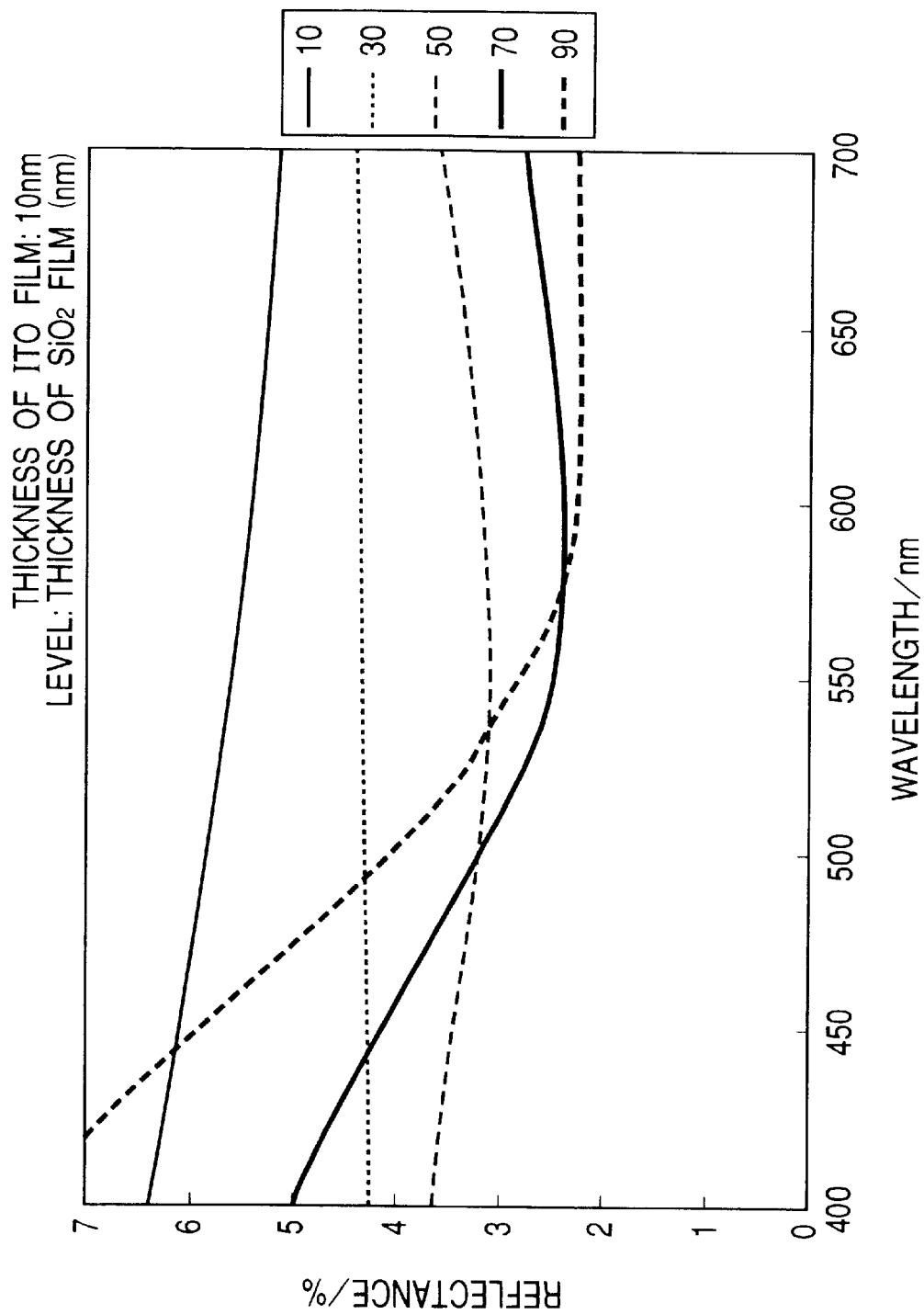
FIG. 19 is a graph showing the spectral reflection characteristics of samples with a conductive film and a low refractive index film of silicon oxide.

Further, five samples in all were prepared, which consisted of a non-alkali glass substrate, a resin film of the same material as that of the microlens formed on the substrate, a silicon oxide film 10 nm to 90 nm thick formed on the resin film by the sputtering process, and an ITO film 10 nm thick formed on the silicon oxide film by the sputtering process. The spectral reflectance of the surface of each sample was measured. The relationship between the spectral reflectance and the thickness of the silicon oxide and ITO films for each sample is shown in FIG. 19.

Figure 20:
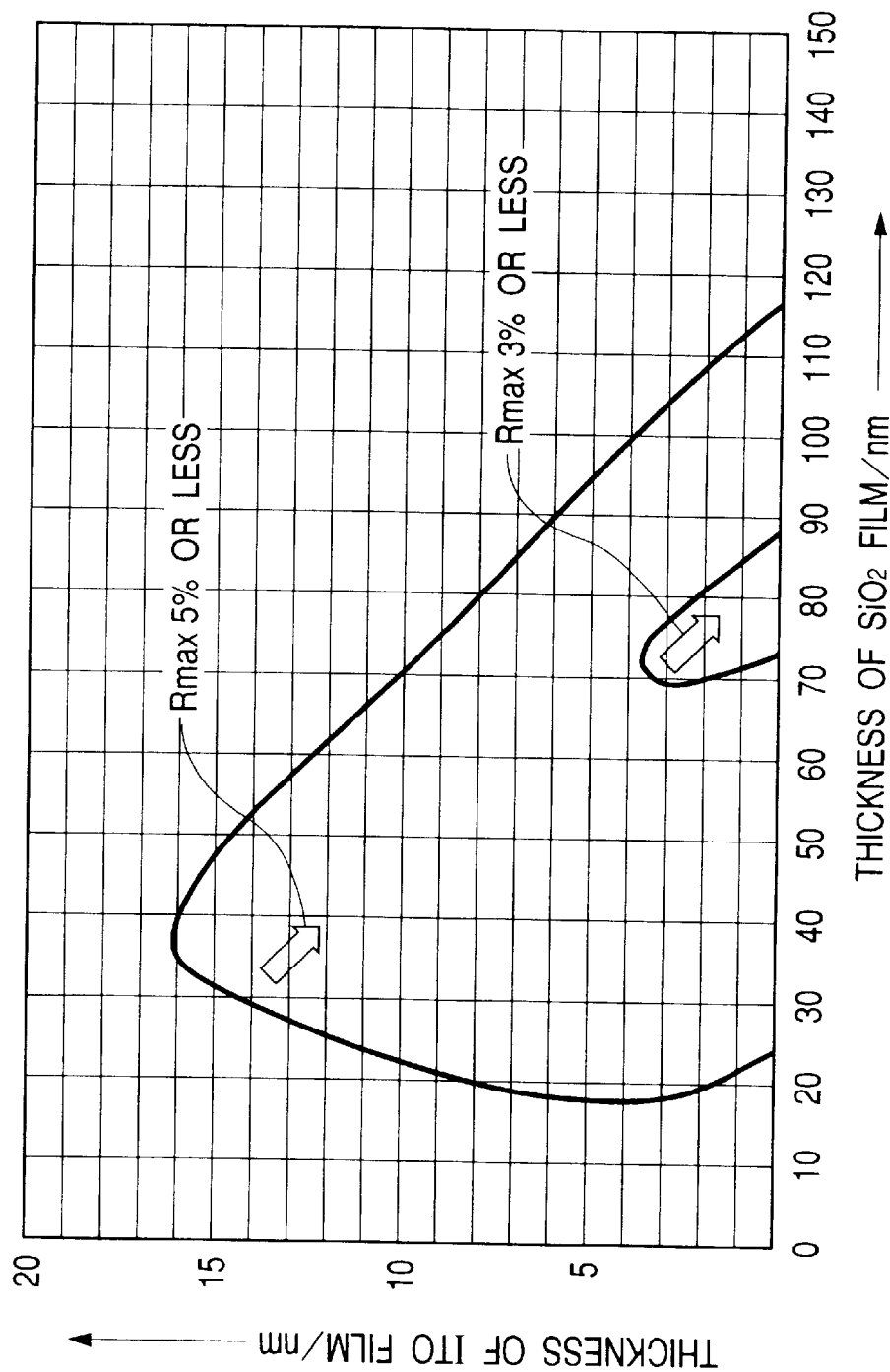
FIG. 20 is a graph showing the film thickness dependency of a conductive film and a low refractive index film of silicon oxide both having the maximum reflectance.

In this case, preferably, the thickness of the silicon oxide film is selected to be 30 nm to 70 nm. FIG. 20 shows the thickness of the silicon oxide and ITO films when the maximum reflectance in the entire area of visible rays is 5% and 3%. Considering the maximum reflectance of the microlens before the formation of these films is 5.2% to 6.0%, it is evident that there are a wide variety of alternatives for the film thickness allowing the maximum reflectance to be 5% or less and the number of the alternatives for the design and production of the microlens is large.

Experiment 6

The present inventors prepared a sample which consisted of a non-alkali glass substrate, a resin film of the same material as that of the microlens formed on the substrate, a magnesium fluoride film 90 nm thick formed on the resin film by the vacuum evaporation process, and an ITO film 2 nm thick formed on the magnesium fluoride film by the sputtering process.

Figure 21:
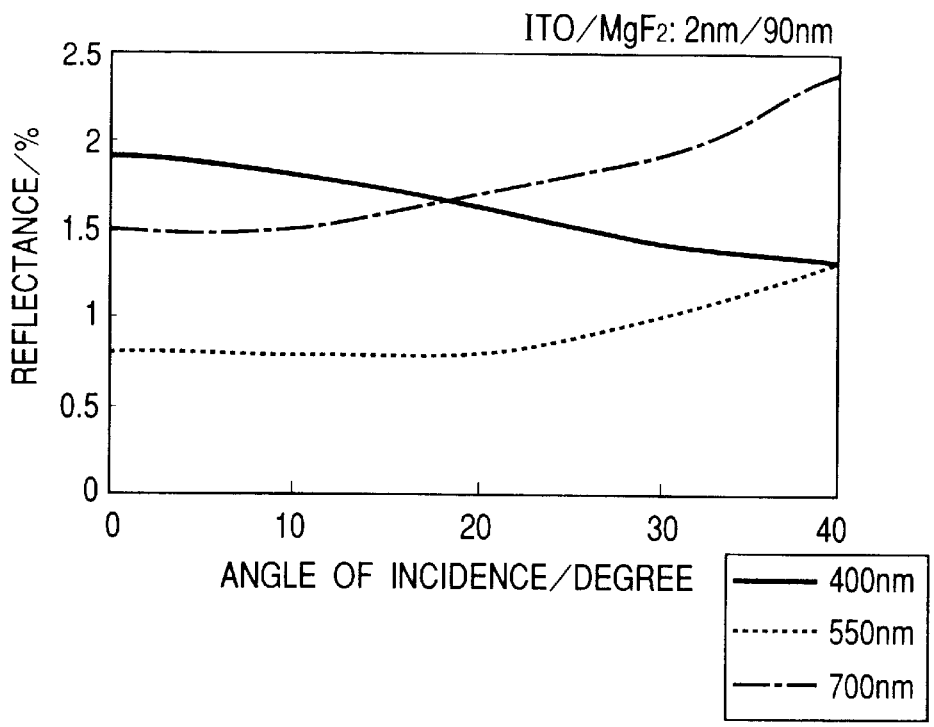
FIG. 21 is a graph showing the incident angle dependency of the reflectance of samples with a conductive film and a low refractive index film of magnesium fluoride.

The surface of the sample was irradiated with light with wavelengths 400 nm, 550 nm and 700 nm while varying the incident angle (angle of obliquity to the normal line of the sample surface) within the range of 0 degree to 40 degrees, and the incident angle dependency of reflectance was measured. The results are shown in FIG. 21.

Then, a sample was prepared which consisted of a non-alkali glass substrate, a resin film of the same material as that of the microlens formed on the substrate, a silicon oxide film 80 nm thick formed on the resin film by the vacuum evaporation process, and an ITO film 2 nm thick formed on the silicon oxide film by the sputtering process.

Figure 22:
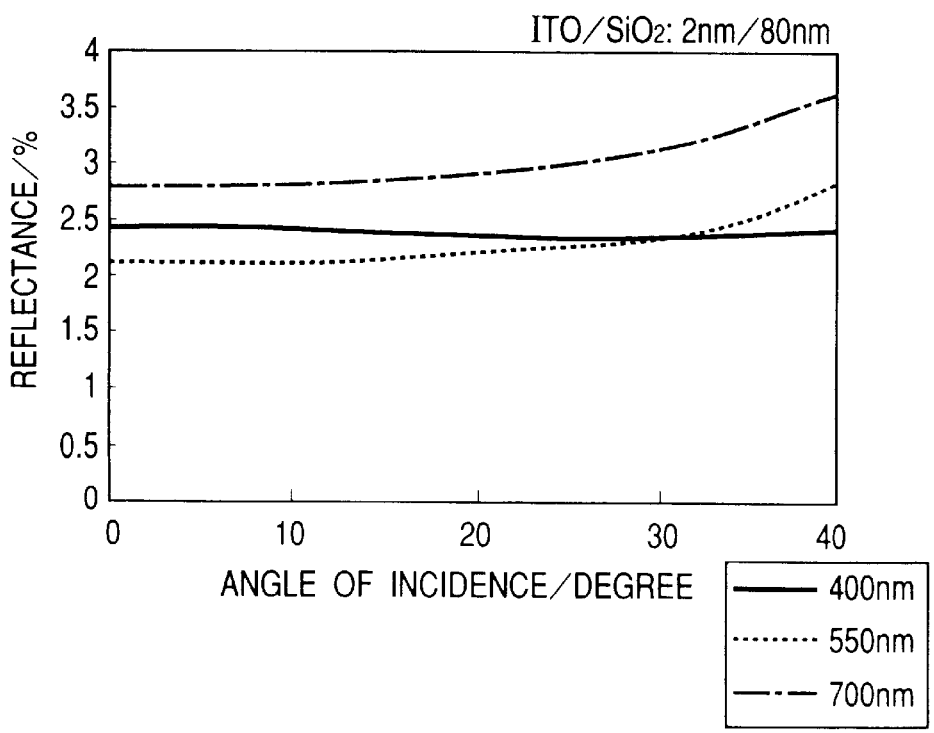
FIG. 22 is a graph showing the incident angle dependency of the reflectance of samples with a conductive film and a low refractive index film of silicon oxide.

The surface of the sample was irradiated with light with wavelengths 400 nm, 550 nm and 700 nm while varying the incident angle (angle of obliquity to the normal line to the sample surface) within the range of 0 degree to 40 degrees, and the incident angle dependency of reflectance was measured. The results are shown in FIG. 22.

In the case of, for example, the solid state imaging device of cameras, it sometimes has to receive light entering at a wide range of incident angle. Therefore, the solid state imaging device is preferred of which reflectance has a small incident angle dependency. In this experiment, the variation of the reflectance was within the range of 1% or less, which indicates the reflectance of the samples are preferable.

As described in detail above, according to the solid state imaging device of this embodiment, the surface of the microlenses is allowed to be conductive, thereby the adhesion of dust particles due to static electricity can be prevented. In addition, if the thickness of the light transmitting conductive film is selected properly as described above, the surface reflectance can be restricted to almost the same level as that of the microlens without such a conductive film.

In addition, a low refractive index film with refractive index lower than that of the component of the microlens is provided on the surface of the microlens, thereby the surface reflectance can be decreased.

Further, according to the production process of the solid state imaging device of this embodiment, the microlenses are subjected to UV curing treatment before forming a low refractive index film and a light transmitting conductive film thereon, thereby the volatile component of the microlenses themselves can be removed and the heat resistance and mechanical strength of the same can be enhanced. As a result, the allowable film-forming temperature at the time of low refractive index film and conductive film formation can be increased. The increased film-forming temperature enables the improvement of the conductive film both in quality and in adhesion to the surface of the microlens. Furthermore, due to the enhanced mechanical strength of the microlenses themselves, their resistance to influence with cleaning is improved as well.

Embodiment 3

In the above-mentioned embodiments 1 and 2, on the surface of a microlens 3, a conductive film 5 was formed of the starting material different from that of the microlens.

In this embodiment, a conductive surface is obtained by modifying the surface of a microlens 3.

In order to obtain the conductive surface, the surface of the microlens 3 is exposed to inert gas ions such as nitrogen and argon, to change the surface portion into a surface-modified conductive layer.

Since the resistivity of the material of the microlens is about $10^6$ Ω·cm, the resistivity can be decreased to several tens Ω·cm to several hundreds Ω·cm by controlling the dose of the ions and the exposing energy.

Accordingly, the surface of the microlens having sheet resistance as described above can be obtained.

The presence of the surface-modified layer can be determined by the SIMS.

For the other construction and constituents, the embodiments 1 and 2 apply to this embodiment.

Embodiment 4

In this embodiment, a conductive film containing carbon as a main component is formed on the surface of a microlens 3.

A DLC thin film and an amorphous carbon film (a-C film) can be used as the conductive film 5 of the present invention by doping them with dopants such as boron, phosphorus and fluorine.

Even a non-doped DLC thin film or a-C film can be used as the conductive film 5 of the present invention by controlling the rate of the $sp^2$ bond.

When forming a conductive film containing carbon as a main component by the plasma CVD method, for example, the plasma enhanced CVD system with parallel plate electrodes and a microwave supplier is preferably used.

The microlens is mounted on one electrode constituting parallel plate electrodes and RF power is applied to the parallel plate electrodes while supplying carbon-containing gas and, if necessary, hydrogen gas and an inert gas as well. At the same time, microwave power is supplied between the parallel plate electrodes through a microwave transmitting dielectric window provided on the side wall of a chamber, so as to accelerate the ionization of the gases.

The characteristics of the DLC thin film can be varied widely depending on the film-forming conditions, and in order to obtain the characteristics available for the present invention, it is necessary to select the characteristics while directing one's attention to the spectral transmittance and electric conductivity thereof. However, in many cases, the spectral transmittance and the electric conductivity are traded off against each other when controlling the characteristics of the DLC thin film. In this embodiment, the present inventors selected, as the measures of the characteristics of the DLC thin film, the rate of each bonding type ($sp^2$ and $sp^3$ bonds) among the carbon atoms constituting the DLC thin film and the hydrogen content of the same. After examining various types of DLC thin films, the present inventors have found it necessary for the rate of $sp^3$ bond to be required to be larger than that of $sp^2$ bond and the hydrogen atom content of the film be 20 atom % or less.

A conductive DLC thin film in which the rate of $sp^3$ bond is larger than that of $sp^2$ bond can be formed by, for example, flowing 16 sccm of $CH_4$ gas as a carbon-containing gas and 4 sccm of Ar gas, keeping the pressure within the chamber at 6.7 Pa and supplying 100 W RF power (13.56 MHZ) and 300 W microwave power (2.45 GHZ).

The $sp^2$-bond to $sp^3$-bond ratio can be determined by the ratio of peak intensity at 1350 $nm^{-1}$ (corresponding to $sp^2$ bond) to peak intensity at 1550 $nm^{-1}$ (corresponding to $sp^3$ bond) if the obtained DLC thin film is examined by Raman spectroscopy.

When using the ion beam sputtering process to form a conductive film containing carbon as a main component, optimizing the ion energy of the carbon ion beam enables the formation of a conductive DLC thin film in which the rate of $sp^3$ bond is larger than that of $sp^2$ bond.

Such a conductive DLC thin film can be formed by, for example, using $C_6H_6$, keeping the pressure at 0.1 Pa, and applying −1000 V or more substrate bias.

In the present invention, preferably, the hydrogen content of the conductive film is 20 atom % or less.

The hydrogen content can be decreased to 20 atom % or less by decreasing the flow rate of $CH_4$ and $H_2$ when using the plasma CVD process and by increasing the substrate bias when using the ion beam sputtering process.

The hydrogen content can be analyzed by the FT-IR method.

EXAMPLES

Example 1

In the following, a first example of the present invention will be described in detail with reference to FIG. 3.

A 6-inch silicon wafer as a semiconductor substrate was prepared to form a CMOS solid state imaging device.

A color filter was formed on the semiconductor substrate by the known method and then, in order to planarize the rough portions of the surface of the color filter, the surface was coated with acrylic resin to form a planarizing film 2.

The surface of the planarizing film 2 was coated with positive i-line photoresist, subjected to exposure with an aligner, and developed to form a rectangular photoresist pattern 3a. Then, the entire surface on which the pattern 3a had been formed was irradiated with ultraviolet rays at 2000 $mJ/cm^2$ to bleach the resist. Then, the pattern 3a was heated to hot-melt the component resin of the same. The molten resin was formed into a microlens 3 with its convex surface facing up, due to the surface tension of its own.

Then, the formed microlens 3 was placed in an inert gas consisting of nitrogen and heated while being irradiated with ultraviolet rays so as to be cured in order to remove the volatile component contained therein and enhance the physical strength and heat resistance thereof. At this time, the irradiation with ultraviolet was performed at an illuminance of 10 $mW/cm^2$ during the first 15 seconds, then at an illuminance of about 800 $mW/cm^2$.

The initial irradiation process at a low illuminance was the process for allowing the microlens to moderately diffuse and emit a slight amount of volatile component remaining therein and/or the volatile component produced by the irradiation with ultraviolet and by the heat generation accompanying the irradiation. The microlens was heated with its semiconductor substrate placed on a hot plate while increasing the temperature of the hot plate from 90° C., at the start of irradiation with ultraviolet light, to the maximum temperature of 220° C. in 1.5° C./sec increments.

After curing the microlens 3, an ITO film 2 nm thick as a conductive film was formed on the surface of the microlens by the sputtering process. The film-forming temperature was 200° C.

Three wafers of the solid state imaging device equipped with a microlens were prepared through the above processes.

The measured value of the sheet resistance of the microlens was about 4 kΩ/square.

When the thickness of the ITO film was 15 nm, the sheet resistance of the microlens was about 300 Ω/square, and when the thickness of the ITO film was 140 nm, the sheet resistance of the microlens was about 18 Ω/square. In any case, the ITO film was allowed to have sufficient conductivity to prevent charging due to static electricity on the surface of the microlens.

Three wafers (reference samples) of the solid state imaging device in accordance with the prior art equipped with a microlens of which resin surface was exposed were prepared, separately.

The wafers of the solid state imaging device with the microlens formed in accordance with this example and the wafers as reference samples were left in the same clean room for one week, and the number of dust particles adhering on the microlens of each wafer was measured. The average number per wafer of the dust particles 0.5 μm or larger in diameter adhering on the wafer surface in accordance with this example was 2.0, on the other hand, that of the dust particles adhering on the wafer surface of the reference samples was about 12.

Further, the wafers of this example and of the reference samples described above were loaded into respective conductive wafer cassettes, the cassettes were left in the same clean room for one week in state where the light transmitting conductive film on the surface of the microlens and the wafer cassette were short-circuited, and the number of the dust particles adhering on the microlens of each wafer was measured.

The average number per wafer of the dust particles adhering on the reference samples was about 12, on the other hand, that of the dust particles adhering on the wafer surface in accordance with this example was 1.0 or less.

Then, when subjecting the above wafers to ultrasonic cleaning in a surfactant-added aqueous solution, in the wafers of reference samples, cloudiness, that is, deterioration was observed on the surface of some microlenses. However, in the wafers of this example, deterioration was not observed on the surface of the microlens and there existed no peeling of the ITO film, either.

After passing the wafers of this example through post-processes, that is, inspection process, dicing process and package process, the number of the dust particles adhering thereon was measured, and it was found that the number was hardly increased.

The effect of decreasing dust particle adhesion is amplified by performing the inspection process, dicing process, chip handling after the dicing process, and the package process while fixing the surface of the wafer or chip to ground potential, because the surface potential is fixed at a desired value.

In the solid state imaging device with the microlens formed in accordance with this example, right before being covered with the protective glass or transparent resin of a package, its chip surface (surface of the light transmitting conductive film on the microlens) can be subjected to stronger cleaning than that currently performed.

In this example, right before the surface encapsulation, the inspection of the chip surface was actually performed to confirm the presence of dust particles and then, after passing the chip through a cleaning process with cleaning fluid containing a surfactant, the surface inspection was performed again. As a result, it was observed that all the dust particles were removed and there was no deterioration on the surface of the microlens. Thus, it has been found that, in the microlens of the present invention, even if dust particles adhere on its surface, they can be removed by cleaning, which contributes to the improvement in yield.

Example 2

In the following, a second example of the present invention will be described in detail.

This example differs from the example 1 only in that irradiation with ultraviolet was not performed in the thermal curing treatment conducted after melting the photoresist pattern.

A 6-inch silicon wafer as a semiconductor substrate was prepared to form a CMOS solid state imaging device.

A color filter was formed on the semiconductor substrate by the known method and then the surface of the color filter was coated with acrylic resin to form a planarizing film 2.

The surface of the planarizing film 2 was coated with positive i-line photoresist, subjected to exposure with an aligner, and developed to form a rectangular photoresist pattern 3a. Then, the entire surface on which the pattern 3a had been formed was irradiated with ultraviolet rays at 2000 mJ/cm² to bleach the resist and then the pattern 3a was heated to hot-melt the component resin of the same, so as to form a microlens 3 with its convex surface facing up.

Then, the formed microlens 3 was placed in an inert gas consisting of nitrogen and heated without being irradiated with ultraviolet rays, so as to be thermally cured.

The microlens was heated with its semiconductor substrate placed on a hot plate while increasing the temperature of the hot plate from 90° C. to 220° C. in 1.5° C./sec increments.

After curing the microlens 3, an ITO film 2 nm thick as a conductive film was formed on the surface of the microlens by the sputtering process. The film-forming temperature was 200° C.

The wafers of the solid state imaging device with the microlens formed in accordance with this example were left in the same clean room for one week, and the number of dust particles adhering on the microlens of each wafer was measured. The average number per wafer of the dust particles 0.5 µm or larger in diameter adhering on the wafer surface in accordance with this example was 2.

Further, the wafers of this example were loaded into respective conductive wafer cassettes, the cassettes were left in the same clean room, and the number of the dust particles adhering on the microlens of each wafer was measured.

The average number per wafer of the dust particles adhering on the wafer surface in accordance with this example was 1 or less.

Then, when subjecting the above wafers to ultrasonic cleaning in a surfactant-added aqueous solution, deterioration was not observed on the surface of the microlens and peeling of the ITO film was not observed either.

After passing the wafers of this example through post-processes, that is, inspection process, dicing process and package process, the number of the dust particles adhering thereon was measured, and it was found that the number hardly increased.

Right before the surface encapsulation, the inspection of the chip surface was performed to confirm the presence of dust particles and then, after passing the chip through a cleaning process with cleaning fluid containing a surfactant, the surface inspection was performed again. As a result, it was observed that all the dust particles were removed and there was no deterioration on the surface of the microlens.

Example 3

In the following, a third example of the present invention will be described in detail.

This example differs from the example 1 only in the following two points: the temperature increasing conditions in the thermal curing treatment conducted after melting the photoresist pattern; and film-forming conditions of the ITO film.

A 6-inch silicon wafer as a semiconductor substrate was prepared to form a CMOS solid state imaging device.

A color filter was formed on the semiconductor substrate by the known method and then the surface of the color filter was coated with acrylic resin to form a planarizing film 2.

The surface of the planarizing film 2 was coated with positive i-line photoresist, subjected to exposure with an aligner, and developed to form a rectangular photoresist pattern 3a. Then, the entire surface on which the pattern 3a had been formed was irradiated with ultraviolet rays at 2000 mJ/cm² to bleach the resist and then the pattern 3a was heated to hot-melt the component resin of the same, so as to form a microlens 3 with its convex surface facing up.

Then, the formed microlens 3 was placed in an inert gas consisting of nitrogen and heated while being irradiated with ultraviolet rays, so as to be cured. At this time, the irradiation with ultraviolet was performed at an illuminance of 10 mW/cm² during the first 15 seconds, then at an illuminance of about 800 mW/cm².

The microlens was heated with its semiconductor substrate placed on a hot plate while increasing the temperature of the hot plate from 90° C., at the start of irradiation with ultraviolet light, to 250° C. in 1.0° C./sec increments.

After curing the microlens 3, an ITO film 2 nm thick as a conductive film was formed on the surface of the microlens by the electron beam evaporation process.

The electron beam evaporation process, in which the temperature of the substrate is difficult to control, has not been generally used in the film formation on a microlens, because the heat resistance of the microlens is limited. In this example, however, film-forming time was short because the deposited film was thin, in addition, the heat resistance of the microlens was improved by the ultraviolet curing; thereby the electron beam evaporation process could be adopted.

The measured value of the sheet resistance of the micro lens was about 5 kΩ/square. When the thickness of the ITO film formed by the electron beam evaporation was 15 nm, the sheet resistance of the microlens was about 300 Ω/square, and when the thickness of the ITO film formed by the electron beam evaporation is 140 nm, the sheet resistance of the microlens was about 15 Ω/square. In any case, the ITO film was allowed to have sufficient conductivity to prevent charging due to static electricity on the surface of the microlens.

The wafers of the solid state imaging device with the microlens formed in accordance with this example were left in the same clean room for one week, and the number of dust particles adhering on the microlens of each wafer was measured. The average number per wafer of the dust particles 0.5 μm or larger in diameter adhering on the wafer surface in accordance with this example was 1.7.

Further, the wafers of this example were loaded into respective conductive wafer cassettes, the cassettes were left in the same clean room, and the number of the dust particles adhering on the microlens of each wafer was measured.

The average number per wafer of the dust particles adhering on the wafer surface in accordance with this example was 1.0 or less.

Then, when subjecting the above wafers to ultrasonic cleaning in a surfactant-added aqueous solution, deterioration was not observed on the surface of the microlens and no peeling of the ITO film was observed either.

After passing the wafers of this example through post-processes, that is, inspection process, dicing process and package process, the number of the dust particles adhering thereon was measured, and it was found that the number hardly increased.

Right before the surface encapsulation, the inspection of the chip surface was performed to confirm the presence of dust particles and then, after passing the chip through a cleaning process with cleaning fluid containing a surfactant, the surface inspection was performed again. As a result, it was observed that all the dust particles were removed and there was no deterioration on the surface of the microlens.

According to the examples described above, the adhesion of dust particles on the microlens surface could be prevented.

Furthermore, even though a film structure having the above-described effect was provided on the surface of the microlens, the surface reflectance was kept almost the same as that of the microlens without such a film structure.

Further, the microlens was subjected to an ultraviolet curing treatment before forming a conductive film thereon, thereby the volatile component of the microlens itself could be removed and the heat resistance and mechanical strength of the same could be enhanced. As a result, the film-forming temperature at the time of forming the transparent conductive film was allowed to be higher than that of the prior art. The higher film-forming temperature enabled the improvement of the conductive film both in quality and in resistance to influence with cleaning.

Further, the enhanced mechanical strength of the microlens, in turn, enabled the improvement in resistance to influence with cleaning of the microlens itself. In addition, since the allowable range of the film-forming conditions at the time of forming a transparent conductive film became wider, the degree of freedom could be increased in the film formation.

Since the production required only optimization of the microlens heat treatment process and addition of the transparent conductive film formation process, additional production load was small.

Further, since the microlens can be re-cleaned even in the post-processes, the number of defects in the products, which have already a had high added value, can be decreased, which contributes to the improvement in yield and the reduction of the cost.

The solid state imaging device equipped with the microlens as well as the wafer having the same formed thereon could be kept for long periods without the adhesion of dust particles when they were in state where their conductive films and a low-impedance conductive member were short-circuited.

Example 4

In the following, a fourth example of the present invention will be described in detail with reference to FIGS. 7A to 7D.

A 6-inch silicon wafer as a semiconductor substrate was prepared to form a CMOS solid state imaging device.

A color filter was formed on the semiconductor substrate by the known method and then, in order to planarize the rough portions of the surface of the color filter, the surface was coated with acrylic resin to form a planarizing film 2.

The surface of the planarizing film 2 was coated with positive i-line photoresist, subjected to exposure with an aligner, and developed to form a rectangular photoresist pattern 3a. Then, the entire surface on which the pattern 3a had been formed was irradiated with ultraviolet rays at 2000 mJ/cm$^2$ to bleach the resist and then the pattern 3a was heated to hot-melt the component resin of the same. The molten resin was formed into a microlens 3 with its convex surface facing up due to the surface tension of its own.

Then, the formed microlens 3 was placed in an inert gas consisting of nitrogen and heated while being irradiated with ultraviolet rays so as to be cured, in order to remove the volatile component contained therein and enhance the physical strength and heat resistance thereof. At this time, the irradiation with ultraviolet was performed at an illuminance of 10 mW/cm$^2$ during the first 15 seconds, then at an illuminance of about 800 mW/cm$^2$.

The initial irradiation process at a low illuminance was the process for allowing the microlens to moderately diffuse and emit a slight amount of volatile component remaining therein and/or the volatile component produced by the irradiation with ultraviolet light and by heat generation accompanying the irradiation. The microlens was heated with its semiconductor substrate placed on a hot plate while increasing the temperature of the hot plate from 90° C., at the start of irradiation with ultraviolet light, to the maximum temperature of 250° C. in 1.0° C./sec increments.

After curing the microlens 3, a low refractive index film 8 with thickness 88 nm of aluminum fluoride was formed on the microlens by the vacuum evaporation process, and an ITO film 2 nm thick as a conductive film was formed on the low refractive index film by the sputtering process. The film-forming temperature was 200° C.

Three wafers of the solid state imaging device equipped with a microlens were prepared by the above processes.

The measured value of the sheet resistance of the microlens was about 4 kΩ/square.

When the thickness of the ITO film was 15 nm, the sheet resistance of the microlens was about 300 Ω/square, and when the thickness of the ITO film was 140 nm, the sheet resistance of the microlens was about 18 Ω/square. In any case, the ITO film was allowed to have sufficient conductivity to prevent charging due to static electricity on the surface of the microlens.

Three wafers (reference samples) of the solid state imaging device in accordance with the prior art equipped with a microlens of which resin surface was exposed were prepared, separately.

The wafers of the solid state imaging device with the microlens formed in accordance with this example and the wafers as reference samples were left in the same clean room for one week, and the number of dust particles adhering on the microlens of each wafer was measured. The average number per wafer of the dust particles 0.5 µm or larger in diameter adhering on the wafer surface in accordance with this example was 2.0. On the other hand, the average number per wafer of the dust particles adhering on the wafer surface of the reference samples was about 12.

Further, the wafers of this example and of the reference samples described above were loaded into respective conductive wafer cassettes, the cassettes were left in the same clean room for one week in a state where the light transmitting conductive film on the surface of the microlens and the wafer cassette were short-circuited, and the number of the dust particles adhering on the microlens of each wafer was measured.

The average number per wafer of the dust particles adhering on the reference samples was about 12. On the other hand, the average number per wafer of the dust particles adhering on the wafer surface in accordance with this example was 1.0 or less.

Then, when subjecting the above wafers to ultrasonic cleaning in a surfactant-added aqueous solution, in the wafers of reference samples, cloudiness, that is, deterioration, was observed on the surface of some microlenses. However, in the wafers of this example, deterioration was not observed on the surface of the microlens and peeling of the ITO film was not observed either.

After passing the wafers of this example through post-processes, that is, inspection process, dicing process and package process, the number of the dust particles adhering thereon was measured, and it was found that the number hardly increased.

The effect in decreasing dust particle adhesion is amplified by performing the inspection process, dicing process, chip handling after the dicing process, and package process while fixing the surface of the wafer or chip to ground potential, because the surface potential is fixed at a desired value.

In the solid state imaging device with the microlens formed in accordance with this example, right before being covered with the protective glass or transparent resin of a package, the chip surface of the solid state imaging device (surface of the light transmitting conductive film on the microlens) can be subjected to stronger cleaning than that currently performed.

In this example, right before the surface encapsulation, the inspection of the chip surface was actually performed to confirm the presence of dust particles and then, after passing the chip through a cleaning process with cleaning fluid containing a surfactant, the surface inspection was performed again. As a result, it was observed that all the dust particles were removed and there was no deterioration on the surface of the microlens. Thus, it has been found that, in the microlens of the present invention, even if dust particles adhere on its surface, they can be removed by cleaning, which contributes to the improvement in yield.

Example 5

In this example, a solid state imaging device was produced by the same procedure as in Example 4. This example differs from Example 4 only in that the thickness of the ITO film was 3 nm and a magnesium fluoride film 84 nm thick formed by the vacuum evaporation process was used as a low refractive index film instead of the aluminum fluoride film.

The same effects as in Example 4 were obtained in this example.

Example 6

In this example, a solid state imaging device was produced by the same procedure as in Example 4. This example differs from Example 4 only in that a silicon oxide film 80 nm thick formed by the sputtering process was used as a low refractive index film instead of the aluminum fluoride film.

The same effects as in Example were obtained in this example.

Example 7

In this example, a solid state imaging device was produced by the same procedure as in Example. This example differs from Example 4 only in that a silicon oxide film 80 nm thick formed by the sputtering process was used as a low refractive index film instead of the aluminum fluoride film and irradiation with ultraviolet was not performed in the thermal curing treatment after melting the photoresist pattern. The same effects as in Example were obtained in this example.

Example 8

In the following, an eighth example of the present invention will be described in detail with reference to FIGS. 3A to 3C.

A 6-inch silicon wafer as a semiconductor substrate was prepared to form a CMOS solid state imaging device.

A color filter was formed on the semiconductor substrate by the known method and then, in order to planarize the rough portions of the surface of the color filter, the surface was coated with acrylic resin to form a planarizing film 2.

The surface of the planarizing film 2 was coated with positive i-line photoresist, subjected to exposure with an aligner, and developed to form a rectangular photoresist pattern 3a. Then, the entire surface on which the pattern 3a had been formed was irradiated with ultraviolet rays at 2000 mJ/cm$^2$ to bleach the resist, and then, the pattern 3a was heated to hot-melt the component resin of the same. The molten resin was formed into a microlens 3 with its convex surface facing up, due to the surface tension of its own.

Then, the formed microlens 3 was placed in an inert gas consisting of nitrogen and heated while being irradiated with ultraviolet rays including far ultraviolet of wavelengths 300 nm or less so as to be cured in order to remove the volatile component contained therein and enhance the physical strength and heat resistance thereof. At this time, the irradiation with ultraviolet light was performed at an illuminance of 10 mW/cm$^2$ during the first 15 seconds, and then, at an illuminance of about 800 mW/cm$^2$.

The ultraviolet irradiation process with heating was the process for allowing the microlens to moderately diffuse and emit the volatile component therein and inhibiting the same from emitting gas in the subsequent ion irradiation process. The microlens was heated with its semiconductor substrate placed on a hot plate while increasing the temperature of the hot plate from 90° C., at the start of irradiation with ultraviolet light, to the maximum temperature of 250° C. in 1.0° C./sec increments.

After the curing, the microlens 3 was irradiated with Ar$^+$ ion at an acceleration energy of 100 keV and a dose selected from the range of $1.0 \times 10^{16}$ to $1.0 \times 10^{17}$ cm$^{-2}$, so as to be modified from its surface to the depth of 10 nm.

Three wafers of the solid state imaging device equipped with a microlens were prepared through the above processes.

The measured values of the sheet resistance of the microlens of the two of the above three wafers were: 500 kΩ/square when the dose of Ar$^+$ ion was $1.0 \times 10^{16}$ cm$^{-2}$ and 1 kΩ/square when the dose of Ar$^+$ ion was $7.0 \times 10^{16}$ cm$^{-2}$.

The wafers of the solid state imaging device with the microlens formed in accordance with this example were left in the same clean room for one week, and the number of dust particles adhering on the microlens of each wafer was measured. The average number per wafer of the dust particles 0.5 μm or larger in diameter adhering on the wafer surface in accordance with this example was 2.7.

Further, after removing the dust particles, the wafers of this example described above were loaded into respective conductive wafer cassettes, the cassettes were left in the same clean room for one week in state where the modified layer of the surface of the microlens and the wafer cassette were short-circuited, and the number of the dust particles adhering on the microlens of each wafer was measured.

The average number per wafer of the dust particles adhering on the wafer surface in accordance with this example was 1.0 or less.

Then, when subjecting the above wafers to ultrasonic cleaning with a surfactant-added aqueous solution, 1% by weight aqueous solution of hydrogen chloride and 1% by weight aqueous solution of sodium hydroxide, respectively, unintended deterioration was not observed on the surface of the microlens and peeling of the modified layer formed on the same was not observed either.

After passing the wafers of this example through post-processes, that is, inspection process, dicing process and package process, the number of the dust particles adhering thereon was measured, and it was found that the number hardly increased.

The effect in decreasing dust particle adhesion is amplified by performing the inspection process, dicing process, chip handling after the dicing process, and package process while fixing the surface of the wafer or chip to ground potential, because the surface potential is fixed at a desired value.

Example 9

A microlens with a conductive modified layer formed on its surface was formed on a glass substrate in the same manner as in Example 8.

The measured value of its reflectance in the visible area was 6% or lower, and there was no substantial decrease in reflectance compared with the microlens before forming the conductive modified layer on its surface.

Example 10

A microlens was formed on a CMOS solid state imaging device in the same manner as the example 8. Three samples were prepared.

The surface of the microlens of each sample was irradiated with nitrogen ions at a dose selected from the range of $1.0 \times 10^{16}$ to $1.0 \times 10^{17}$ cm$^{-2}$ and an acceleration energy of 100 keV.

The sheet resistance values of the microlenses of which surface had been modified by the nitrogen ion irradiation were: 500 kΩ/square when the dose was $1.0 \times 10^{16}$ cm$^{-2}$; and 1 kΩ/square when the dose was $7.0 \times 10^{16}$ cm$^{-2}$.

The number of the dust particles adhering on the microlens of each wafer was measured in the same manner as in Example 8. The average number per wafer was 2.3, and when using conductive cassettes, the average number was 1 or less. The resistance to influence with cleaning of the microlens was just like that in Example 8.

Example 11

In the following, an eleventh example of the present invention will be described in detail with reference to FIGS. 3A to 3C.

A 6-inch silicon wafer as a semiconductor substrate was prepared to form a CMOS solid state imaging device.

A color filter was formed on the semiconductor substrate by the known method and then, in order to planarize the rough portions of the surface of the color filter, the surface was coated with acrylic resin to form a planarizing film 2.

The surface of the planarizing film 2 was coated with positive i-line photoresist, subjected to exposure with an aligner, and developed to form a rectangular photoresist pattern 3a. Then, the entire surface on which the pattern 3a had been formed was irradiated with ultraviolet rays at 2000 mJ/cm$^2$ to bleach the resist, and then, the pattern 3a was heated to hot-melt the component resin of the same. The molten resin was formed into a microlens 3 with its convex surface facing up, due to the surface tension of its own.

Then, the formed microlens 3 was placed in an inert gas consisting of nitrogen and heated while being irradiated with ultraviolet rays including far ultraviolet of wavelength 300 nm or less so as to be cured, in order to remove the volatile component contained therein and enhance the physical strength and heat resistance thereof. At this time, the irradiation with ultraviolet light was performed at an illuminance of 10 mW/cm$^2$ during the first 15 seconds, then at an illuminance of about 800 mW/cm$^2$.

The ultraviolet irradiation process with heating was important for enhancing the adhesion of the microlens to a DLC thin film to be formed thereon. The microlens was heated with its semiconductor substrate placed on a hot plate while increasing the temperature of the hot plate from 90° C., at the start of irradiation with ultraviolet, to the temperature of 250° C. in 1.0° C./sec increments.

DCL thin films with thickness selected from 10 nm to 200 nm were formed on the surface of respective micro lenses by the ion beam sputtering process described above.

In the microlens with a DLC thin film 10 nm thick, the sheet resistance was 200 kΩ/square, and in the microlens with a DLC thin film 200 nm thick, the sheet resistance was 10 kΩ/square.

In these DLC thin films, the rate of the sp$^3$ bond is larger than that of the sp$^2$ bond and the hydrogen content was 20 atom % or less.

The wafers of the solid state imaging device with the microlens in accordance with this example on which the DLC thin film 10 nm thick was formed were left in the same clean room for one week, and the number of dust particles adhering on the microlens of each wafer was measured. The average number per wafer of the dust particles 0.5 μm or larger in diameter adhering on the wafer surface in accordance with this example was 2.7.

Further, after removing the dust particles, the wafers of this example described above were loaded into respective conductive wafer cassettes, the cassettes were left in the same clean room for one week in state where the modified layer of the surface of the microlens and the wafer cassette were short-circuited, and the number of the dust particles adhering on the microlens of each wafer was measured.

The average number per wafer of the dust particles adhering on the wafer surface in accordance with this example was 1.0 or less.

Then, when subjecting the above wafers to ultrasonic cleaning with a surfactant-added aqueous solution, 1% by weight aqueous solution of hydrochloric acid and 1% by weight aqueous solution of sodium hydroxide, respectively, unintended deterioration was not observed on the surface of the microlens and peeling of the DLC thin film formed on the same was not observed either.

After passing the wafers of this example through post-processes, that is, inspection process, dicing process and package process, the number of the dust particles adhering thereon was measured, and it was found that the number hardly increased.

The effect in decreasing the dust particle adhesion is amplified by performing the inspection process, dicing process, chip handling after the dicing process, and package process while fixing the surface of the wafer or chip to ground potential, because the surface potential is fixed to a desired value.

Example 12

A microlens with a DLC thin film formed on its surface was formed on a glass substrate in the same manner as in Example 11.

The measured value of its reflectance in the visible area was 6% or lower, and there was no substantial decrease in reflectance compared with the microlens before forming the conductive modified layer on its surface.

Example 13

A microlens was formed on a CMOS solid state imaging device in the same manner as the example 11. Three samples were prepared.

DLC thin films with thickness selected from the range of 10 nm to 200 nm were formed on the microlenses by the plasma CVD process using RF power and microwave power with a mixed gas of methane gas, hydrogen gas and helium gas.

The sheet resistance values of the microlenses were: 500 kΩ/square when the thickness of the DLC thin film was 10 nm; and 20 kΩ/square when the thickness of the same was 200 nm.

In these DLC thin films, the rate of the $sp^3$ bond is larger than that of the $sp^2$ bond and the hydrogen content was 20 atom % or less.

The number of the dust particles adhering on the microlens of each wafer was measured in the same manner as the example 11. The average number per wafer was 2.3, and when using conductive cassettes, the average number per wafer was 1 or less. The resistance to influence with cleaning of the microlens was just like that of the example 11.

Figure 23:
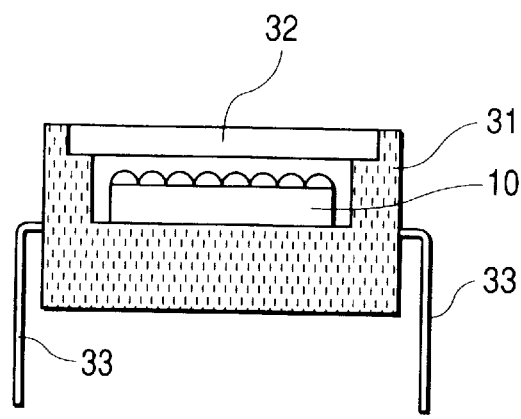
FIG. 23 is a schematic view in section of a packaged solid state imaging device in accordance with one embodiment of the present invention.
Figure 24:
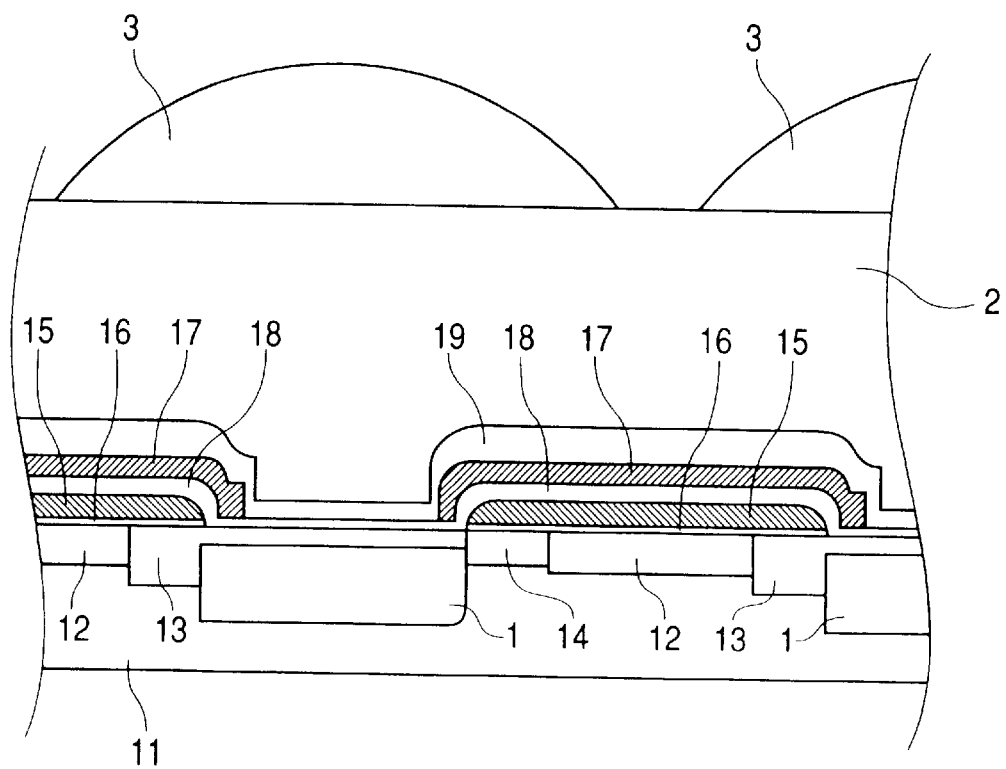
FIG. 24 is a schematic view in section of a solid state imaging device of the prior art.

FIG. 23 shows a package construction of a solid state imaging device equipped with a microlens which is for use in the present invention.

Reference numeral 31 denotes a substrate of, for example, ceramics, which can house a solid state imaging device 10 in its concave portion. Reference numeral 32 denotes a protective sheet of, for example, glass and transparent resin, through which the solid state imaging device 10 is irradiated with light. The inside the package may be filled with an inert gas, etc. Reference numeral 33 denotes external lead terminals coming in contact with various terminals of the solid state imaging device, one of which can be used for keeping the light transmitting conductive film of the microlens surface at ground potential via a connecting wire not shown in the figure if it is kept at ground potential during the operation.

According to the present invention, the light transmitting conductive film prevents the surface of the microlens from being charged, thereby the adhesion of dust particles on the same can be prevented.

What is claimed is:

1. A microlens, a surface of which is coated with a light transmitting conductive film and a light transmitting low-refractive-index film with a refractive index lower than that of a component of the microlens, which said films are laminated on each other to form a structure in which the light transmitting conductive film is an upper layer and the light transmitting low-refractive-index film is a lower layer.

2. The microlens according to claim 1, said light transmitting conductive film is a metal oxide film.

3. The microlens according to claim 1, a thickness of said light transmitting conductive film is in a range of 1 nm to 200 nm.

4. The microlens according to claim 3, said thickness of the light transmitting conductive film is in a range of 1 nm to 20 nm.

5. The microlens according to claim 1, wherein a thickness of said low-refractive-index film is in a range of 10 nm to 130 nm.

6. The microlens according to claim 1, wherein said conductive film is a film containing carbon as a main component.

7. The microlens according to claim 1, wherein said conductive film is a diamond-like carbon thin film.

8. The microlens according to claim 1, wherein said conductive film is a film containing carbon as a main component, a rate of $sp^3$ bond between carbon atoms being larger than that of $sp^2$ bond therebetween.

9. The microlens according to claim 1, wherein said conductive film is a film containing carbon as a main component and hydrogen, a content of hydrogen being 20 atom % or less.

10. A solid state imaging device comprising a photoreceiving portion for performing a photoelectric conversion and a microlens provided on the photoreceiving portion, wherein a surface of the microlens is coated with a light transmitting conductive film and a low-refractive-index film with a refractive index lower than that of a component of the microlens, which said films are laminated on each other to form a structure in which the light transmitting conductive film is an upper layer and the light transmitting low-refractive-index film is a lower layer.

11. The solid state imaging device according to claim 10, wherein said light transmitting conductive film is a metal oxide film.

12. The solid state imaging device according to claim 10, wherein said light transmitting conductive film is a film containing carbon as a main component.

13. The solid state imaging device according to claim 10, wherein a thickness of said light transmitting conductive film is in a range of 1 nm to 200 nm.

14. The solid state imaging device according to claim 13, wherein said thickness of the light transmitting conductive film is in a range of 1 nm to 20 nm.

15. The solid state imaging device according to claim 10, wherein said microlens is formed on or above a color filter.

16. The solid state imaging device according to claim 10, further comprising a means for keeping said light transmitting conductive film at a predetermined potential.

17. The solid state imaging device according to claim 10, wherein a thickness of said low-refractive-index film is in a range of 10 nm to 130 nm.

18. The solid state imaging device according to claim 10, said conductive film is a film containing carbon as a main component.

19. The solid state imaging device according to claim 10, wherein said conductive film is a diamond-like carbon thin film.

20. The solid state imaging device according to claim 10, wherein said conductive film is a film containing carbon as a main component, a rate of $sp^3$ bond between carbon atoms being lager than that of $sp^2$ bond therebetween.

21. The solid state imaging device according to claim 10, wherein said conductive film is a film containing carbon as a main component and hydrogen, a content of hydrogen being 20 atom % or less.

22. The solid state imaging device according to claim 10, wherein said conductive film is a film containing carbon, as a main component, a thickness of which is in a range of 1 nm to 200 nm.

23. The solid state imaging device according to claim 10, wherein said conductive film is comprised of a surface layer of said microlens which has been modified by ion irradiation.

* * * * *

UNITED STATES PATENT AND TRADEMARK OFFICE
CERTIFICATE OF CORRECTION

PATENT NO. : 6,586,811 B2
DATED : July 1, 2003
INVENTOR(S) : Yasuhiro Sekine

It is certified that error appears in the above-identified patent and that said Letters Patent is hereby corrected as shown below:

Column 1,
Line 47, "patter" should read -- pattern --.

Column 2,
Line 6, "charged." should read -- to charge. --.

Column 4,
Line 14, "film" should read -- film and --; and
Line 66, "which" should read -- which the --.

Column 5,
Line 36, "charged," should read -- charged; --;
Line 37, "prevented." should read -- prevented. ¶ Embodiment 1 -- (center); and
Line 65, "microlens 3," should read -- microlens 3; --.

Column 6,
Line 37, "having" should read -- having been --.

Column 8,
Line 22, "easily, in" should read -- easily. In --;
Line 32, "types" should read -- types of --.
Line 37, "conductive," should read -- conductive; --; and
Line 46, "thereon," should read -- thereon; --.

Column 9,
Line 24, "microlens 3," should read -- microlens 3; --; and
Line 40, "cive" should read -- ctive --.

Column 10,
Line 3, "having" should read -- having been --; and
Line 56, "thereon, in" should read -- thereon. In --.

Column 11,
Line 39, "there are" should read -- there is --.

Column 12,
Line 56, "theses" should read -- these --.

UNITED STATES PATENT AND TRADEMARK OFFICE
CERTIFICATE OF CORRECTION

PATENT NO. : 6,586,811 B2
DATED : July 1, 2003
INVENTOR(S) : Yasuhiro Sekine

It is certified that error appears in the above-identified patent and that said Letters Patent is hereby corrected as shown below:

Column 13,
Line 53, "conductive," should read -- conductive; --; and
Line 62, "microlens," should read -- microlens; --.

Column 14,
Line 1, "thereon," should read -- thereon; --.

Column 18,
Line 63, "micro" should read -- micro- --.

Column 19,
Line 45, "thereon," should read -- thereon; --.

Column 20,
Line 7, "state" should read -- a state --.

Column 22,
Lines 15 and 27, "Example" should read -- Example 4 --; and
Line 20, "Example." should read -- Example 4. --.

Column 23,
Line 21, "state" should read -- a state --; and
Line 59, "the example" should read -- in Example --.

Column 24,
Line 47, "micro lenses" should read -- microlenses --.

Column 25,
Line 1, "state" should read -- a state --;
Line 55, "as the" should read -- as in --;
Line 56, "example" should read -- Example --; and
Line 59, "the example" should read -- in Example --.

Column 26,
Line 2, "inside" should read -- inside of --;
Line 12, "charged," should read -- charged; --;
Line 22, "said" should read -- wherein said --;
Line 24, "1," should read -- 1, wherein --; and
Line 27, "said" should read -- wherein said --.

UNITED STATES PATENT AND TRADEMARK OFFICE
CERTIFICATE OF CORRECTION

PATENT NO. : 6,586,811 B2
DATED : July 1, 2003
INVENTOR(S) : Yasuhiro Sekine

It is certified that error appears in the above-identified patent and that said Letters Patent is hereby corrected as shown below:

Column 27,
Line 10, "said" should read -- wherein said --.

Column 28,
Line 2, "lager" should read -- larger --.

Signed and Sealed this

Third Day of February, 2004

JON W. DUDAS
*Acting Director of the United States Patent and Trademark Office*